United States Patent
Kaneko et al.

(10) Patent No.: US 12,247,319 B2
(45) Date of Patent: Mar. 11, 2025

(54) METHOD FOR PRODUCING A SiC SEED CRYSTAL FOR GROWTH OF A SiC INGOT BY HEAT-TREATING IN A MAIN CONTAINER MADE OF A SiC MATERIAL

(71) Applicants: KWANSEI GAKUIN EDUCATIONAL FOUNDATION, Hyogo (JP); TOYOTA TSUSHO CORPORATION, Nagoya (JP)

(72) Inventors: Tadaaki Kaneko, Hyogo (JP); Kiyoshi Kojima, Tokyo (JP)

(73) Assignees: KWANSEI GAKUIN EDUCATIONAL FOUNDATION, Hyogo (JP); TOYOTA TSUSHO CORPORATION, Nagoya (JP)

( * ) Notice: Subject to any disclaimer, the term of this patent is extended or adjusted under 35 U.S.C. 154(b) by 470 days.

(21) Appl. No.: 17/633,096

(22) PCT Filed: Aug. 5, 2020

(86) PCT No.: PCT/JP2020/030078
§ 371 (c)(1),
(2) Date: Feb. 4, 2022

(87) PCT Pub. No.: WO2021/025084
PCT Pub. Date: Feb. 11, 2021

(65) Prior Publication Data
US 2022/0333270 A1    Oct. 20, 2022

(30) Foreign Application Priority Data

Aug. 6, 2019 (JP) .................................. 2019-144543

(51) Int. Cl.
*C30B 23/06* (2006.01)
*C30B 23/02* (2006.01)
(Continued)

(52) U.S. Cl.
CPC ............ *C30B 33/02* (2013.01); *C30B 23/025* (2013.01); *C30B 23/063* (2013.01); *C30B 25/10* (2013.01);
(Continued)

(58) Field of Classification Search
CPC ....... C30B 23/00; C30B 23/02; C30B 23/025; C30B 23/06; C30B 23/063; C30B 23/066;
(Continued)

(56) References Cited

U.S. PATENT DOCUMENTS

2003/0070611 A1    4/2003  Nakamura et al.
2010/0019991 A1    1/2010  Hillis et al.
(Continued)

FOREIGN PATENT DOCUMENTS

CN    105826186 A    8/2016
CN    113227465 A    8/2021
(Continued)

OTHER PUBLICATIONS

Communication pursuant to Rule 164(1) EPC dated Jul. 10, 2023 providing the partial European search report issued in EP application No. 20850134.6.
(Continued)

*Primary Examiner* — Kenneth A Bratland, Jr.
(74) *Attorney, Agent, or Firm* — Calfee, Halter & Griswold LLP

(57) ABSTRACT

An object of the present invention is to provide a novel technology capable of achieving high-quality SiC seed crystal, SiC ingot, SiC wafer and SiC wafer with an epitaxial film. The present invention, which solves the above object, is a method for producing a SiC seed crystal for growth of a SiC ingot, the method including a heat treatment step of heat-treating a SiC single crystal in an atmosphere containing Si element and C element. As described above, by
(Continued)

heat-treating the SiC single crystal in an atmosphere containing the Si element and the C element, it is possible to produce a high-quality SiC seed crystal in which strain and crystal defects are suppressed.

17 Claims, 14 Drawing Sheets

(51) Int. Cl.
  *C30B 25/10* (2006.01)
  *C30B 25/18* (2006.01)
  *C30B 29/36* (2006.01)
  *C30B 33/02* (2006.01)
  *C30B 33/12* (2006.01)
  *H01L 21/02* (2006.01)

(52) U.S. Cl.
  CPC ............ *C30B 25/186* (2013.01); *C30B 29/36* (2013.01); *C30B 33/12* (2013.01); *H01L 21/02378* (2013.01)

(58) Field of Classification Search
  CPC ......... C30B 25/00; C30B 25/02; C30B 25/10; C30B 25/18; C30B 25/186; C30B 29/00; C30B 29/10; C30B 29/36; C30B 33/00; C30B 33/02; C30B 33/08; C30B 33/12; H01L 21/02378
  USPC ................ 117/84, 88, 94, 97, 106, 937, 951
  See application file for complete search history.

(56) References Cited

U.S. PATENT DOCUMENTS

| | | | |
|---|---|---|---|
| 2010/0199910 A1 | 8/2010 | Watanabe et al. | |
| 2011/0278594 A1* | 11/2011 | Nishiguchi | H01L 29/66068 117/106 |
| 2015/0155166 A1 | 6/2015 | Mahadik et al. | |
| 2015/0294867 A1 | 10/2015 | Torimi et al. | |
| 2016/0011825 A1 | 1/2016 | Ito et al. | |
| 2016/0118257 A1* | 4/2016 | Kaneko | C30B 29/36 438/492 |
| 2017/0323797 A1 | 11/2017 | Torimi et al. | |
| 2018/0216251 A1* | 8/2018 | Aigo | H01L 29/161 |
| 2019/0013640 A1 | 1/2019 | Cheung et al. | |
| 2019/0136409 A1 | 5/2019 | Kaneko et al. | |
| 2019/0376206 A1 | 12/2019 | Fukada et al. | |
| 2021/0398807 A1 | 12/2021 | Kaneko et al. | |
| 2022/0220633 A1 | 7/2022 | Kaneko | |
| 2022/0282395 A1* | 9/2022 | Kaneko | C30B 33/02 |

FOREIGN PATENT DOCUMENTS

| | | |
|---|---|---|
| CN | 114174564 A | 3/2022 |
| EP | 3960912 A1 | 3/2022 |
| EP | 4036285 | 8/2022 |
| JP | H11-087257 A | 3/1999 |
| JP | 2003-321298 A | 11/2003 |
| JP | 2009182240 A | 8/2009 |
| JP | 2009256138 A | 11/2009 |
| JP | 2010-184829 A | 8/2010 |
| JP | 2010278120 A | 12/2010 |
| JP | 2018113303 A | 7/2018 |
| JP | 2018158858 A * | 10/2018 |
| JP | 6525189 B2 | 6/2019 |
| TW | 201630061 A | 8/2016 |
| WO | 2014/076963 A1 | 5/2014 |
| WO | 2014/199615 A1 | 12/2014 |
| WO | 2015/048445 A1 | 4/2015 |
| WO | 2017/188381 A1 | 11/2017 |
| WO | 2018/174105 A1 | 9/2018 |

OTHER PUBLICATIONS

Garcon I et al: "Study of SiC single-crystal sublimation growth conditions", Material Science and Engineering: B vol. B29, No. 1, Jan. 1, 1995, pp. 90-93.

Hassan J et al: "In-situ surface preparation of nominally on-axis 4H-SiC substrates", Journal of Crystal Growth, vol. 310, Issue 20, Oct. 1, 2008, pp. 4430-4437.

Bao Jianfeng et al: "Sequential control of step-bunching during graphene growth on SiC (0001)". Appl. Phys. Lett. 109, 081602 (2016).

English Translation of International Search Report from PCT/JP2020/030078 dated Sep. 29, 2020 (3 pages).

Extended European Search Report from EP Application No. 24162314.9 dated Jul. 18, 2024 (11 pages).

Tadjer Marko J. et al., "Elimination of Basal Plane Dislocations in Epitaxial 4H-SiC via Multicycle Rapid Thermal Annealing", Materials Science Forum, vol. 821-823, Jun. 30, 2015 (Jun. 30, 2015), pp. 297-302.

English translation of Office Action issued in corresponding CN application No. 202080055202.X dated Dec. 30, 2023 (11 pages).

English Translation of Office Action from Chinese Patent Application No. 202080055202.X dated Apr. 8, 2023 (17 pages).

\* cited by examiner (a)

(b)

(c)

(d)

(a)

(b)

(a)

(b)

(a)

(b)

(c)

(d)

(a)

(b)

METHOD FOR PRODUCING A SiC SEED CRYSTAL FOR GROWTH OF A SiC INGOT BY HEAT-TREATING IN A MAIN CONTAINER MADE OF A SiC MATERIAL

CROSS-REFERENCE TO RELATED APPLICATIONS

This application is a 371 of PCT Application No. PCT/JP2020/030078, filed on Aug. 5, 2020, which claims priority to Japanese Application No. 2019-144543, filed on Aug. 6, 2019, the contents of which are hereby incorporated by reference as if recited in their entirety.

TECHNICAL FIELD

The present invention relates to a SiC seed crystal from which strains and dislocation defects have been removed and a method for producing the same, a SiC ingot produced by growing said SiC seed crystal and a method for producing the same, and a SiC wafer produced from the SiC ingot, a SiC wafer with an epitaxial film, and methods for respectively producing the SiC wafer and the SiC wafer with an epitaxial film.

BACKGROUND ART

Silicon carbide (SiC) semiconductor devices are being developed for industrialization because of their high withstand voltage, high efficiency, and capability of high temperature operation as compared to silicon (Si) and gallium arsenide (GaAs) semiconductor devices.

In general, a SiC wafers are produced by slicing a SiC ingot. This SiC ingot is obtained by growing a single crystal SiC on a SiC seed crystal by a sublimation method or the like.

In the production of SiC ingots, there is a problem that dislocation defects (threading edge dislocation, threading screw dislocation, basal plane dislocation, and the like) remain in the ingots. Various methods have been proposed to solve this problem.

Patent Literature 1 discloses a method for producing a SiC ingot including a first growth step of growing a single crystal SiC on a first growth surface and an n-th growth step of growing a single crystal SiC on an n-th growth surface different from the first growth surface. According to the production method disclosed in Patent Literature 1, it is said that a high-quality single crystal SiC can be provided with almost no micropipe defects, screw dislocations, edge dislocations, and stacking faults. Therefore, Patent Literature 1 discloses that the disclosed matter can be used as a high-performance power device.

Patent Literature 2 discloses a technology of discharging threading dislocations from a side surface of an epitaxial film by adjusting an impurity concentration of the epitaxial film to be grown. Patent Literature 2 further discloses that crystal defects can be further suppressed by bulk-growing a single crystal SiC by a sublimation method using this epitaxial film as a seed crystal.

CITATION LIST

Patent Literature

Patent Literature 1: JP 2003-321298 A
Patent Literature 2: JP 2010-184829 A

SUMMARY OF INVENTION

Technical Problem

An object of the present invention is to provide a novel technology capable of achieving high-quality SiC seed crystal, SiC ingot, SiC wafer and SiC wafer with an epitaxial film.

Solution to Problem

The present invention, which solves the above object, is a method for producing a SiC seed crystal for growth of a SiC ingot, the method including a heat treatment step of heat-treating a SiC single crystal in an atmosphere containing Si element and C element.

As described above, by heat-treating the SiC single crystal in an atmosphere containing the Si element and the C element, it is possible to produce a high-quality SiC seed crystal in which strain and crystal defects are suppressed.

In a preferred mode of the present invention, the heat treatment step is a step of heat-treating the SiC single crystal in a semi-closed space where a SiC material is exposed.

As described above, by heat-treating the SiC single crystal in the semi-closed space where the SiC material is exposed, a higher-quality SiC seed crystal can be produced.

In a preferred mode of the present invention, the heat treatment step is a step of heat-treating the SiC single crystal in a main container made of a SiC material.

As described above, by heat-treating the SiC single crystal in the main container made of the SiC material, a higher-quality SiC seed crystal can be produced.

In a preferred mode of the present invention, the heat treatment step includes an etching step of etching the SiC single crystal and/or a crystal growth step of growing the SiC single crystal.

As described above, by including the etching step of etching the SiC single crystal, it is possible to produce a SiC seed crystal having a surface with reduced strain and macro-step bunching.

Further, by including the crystal growth step of growing the SiC single crystal, it is possible to produce a SiC seed crystal having a growth layer with reduced basal plane dislocation and macro-step bunching.

In a preferred mode of the present invention, the etching step and/or the crystal growth step is a step of arranging the SiC single crystal and the SiC material so as to face each other, and performing heating so as to form a temperature gradient between the SiC single crystal and the SiC material.

As described above, in an atmosphere containing Si element and C element, the SiC single crystal and the SiC material are made to face each other, and by heating so as to form a temperature gradient between them, etching of the SiC single crystal and crystal growth can be easily performed.

In a preferred mode of the present invention, the etching step is a step of performing heating so that the SiC single crystal is on a high temperature side and the SiC material is on a low temperature side.

As described above, the SiC single crystal can be easily etched by performing heating so that the SiC single crystal is on the high temperature side and the SiC material is on the low temperature side.

In a preferred mode of the present invention, the crystal growth step is a step of performing heating so that the SiC single crystal is on the low temperature side and the SiC material is on the high temperature side.

As described above, by performing heating so that the SiC single crystal is on the low temperature side and the SiC material is on the high temperature side, crystal growth of the SiC single crystal can be easily performed.

In a preferred mode of the invention, the etching step and/or the crystal growth step includes heating the SiC single crystal in a SiC—C equilibrium vapor pressure environment.

As described above, by including the etching step of etching the SiC single crystal in the SiC—C equilibrium vapor pressure environment, it is possible to produce a high-quality SiC seed crystal from which a strained layer is removed.

Further, by including the crystal growth step of growing the growth layer in the SiC—C equilibrium vapor pressure environment, a high-quality SiC seed crystal having a surface with reduced basal plane dislocation can be produced.

In a preferred mode of the present invention, the etching step and/or the crystal growth step includes a step of arranging and heating the SiC single crystal in a semi-closed space having an atomic number ratio Si/C of equal to or less than 1.

As described above, by arranging and heating the SiC single crystal in the semi-closed space with the atomic number ratio Si/C of equal to or less than 1, a high-quality SiC seed crystal having a surface with reduced strain and basal plane dislocation can be produced.

In a preferred mode of the present invention, the etching step and/or the crystal growth step includes a step of heating the SiC single crystal in a SiC—Si equilibrium vapor pressure environment.

As described above, by performing etching or crystal growth of the SiC single crystal in the SiC—Si equilibrium vapor pressure environment, a high-quality SiC seed crystal having a surface with reduced macro-step bunching can be produced.

In a preferred mode of the present invention, the etching step and/or the crystal growth step includes a step of arranging and heating the SiC single crystal in a semi-closed space having an atomic number ratio Si/C of greater than 1.

As described above, by arranging and heating the SiC single crystal in the semi-closed space where the atomic number ratio Si/C exceeds 1, a high-quality SiC seed crystal having a surface with reduced macro-step bunching can be produced.

In a preferred mode of the present invention, the etching step and/or the crystal growth step includes a step of accommodating the SiC single crystal and a Si vapor supply source in the semi-closed space and heating them.

As described above, by accommodating the SiC single crystal and the Si vapor supply source in the semi-closed space and heating them, a high-quality SiC seed crystal having a surface with reduced macro-step bunching can be easily produced.

In a preferred mode of the present invention, the heat treatment step includes a planarization step of planarizing a surface of the SiC single crystal.

By including such a planarization step, a high-quality SiC seed crystal having a surface with reduced macro-step bunching can be produced.

In a preferred mode of the present invention, the heat treatment step includes a basal plane dislocation reduction step of forming a growth layer with reduced basal plane dislocation on the SiC single crystal.

As described above, by forming a growth layer from which dislocations of the basal plane are removed or reduced on the SiC single crystal, it is possible to suppress propagation of the basal plane dislocation to the SiC ingot in the ingot growth step which is a succeeding step.

In a preferred mode of the present invention, the heat treatment step includes a strained layer removal step of removing a strained layer of the SiC single crystal.

As described above, by removing the strained layer from the SiC single crystal, a SiC seed crystal capable of producing a higher-quality SiC ingot can be obtained.

In a preferred mode of the present invention, the heat treatment step includes a basal plane dislocation reduction step of forming a growth layer with reduced basal plane dislocation on the SiC single crystal after the planarization step.

As described above, by forming a growth layer in which the basal plane dislocation is removed or reduced on the SiC single crystal, a SiC seed crystal capable of producing a higher-quality SiC ingot can be obtained.

In a preferred mode of the present invention, the heat treatment step includes a planarization step of planarizing a surface of the SiC single crystal after the strained layer removal step.

As described above, by further planarization the surface after the strained layer removal step, a SiC seed crystal capable of producing a higher-quality SiC ingot can be obtained.

In a preferred mode of the present invention, the heat treatment step further includes the planarization step after the basal plane dislocation reduction step.

As described above, by further planarizing the surface after the basal plane dislocation reduction step, a SiC seed crystal capable of producing a higher-quality SiC ingot can be obtained.

In a preferred mode of the present invention, the heat treatment step includes the basal plane dislocation reduction step after the strained layer removal step.

As described above, by forming the growth layer with reduced basal plane dislocation on the surface after the strained layer removal step, a SiC seed crystal capable of producing a higher-quality SiC ingot can be obtained.

In a preferred mode of the present invention, the heat treatment step includes the strained layer removal step, the planarization step, the basal plane dislocation reduction step, and the planarization step in this order.

By heat-treating in such an order, a SiC seed crystal having no strained layer, basal plane dislocation and macro-step bunching can be obtained.

In a preferred mode of the present invention, the strained layer removal step is a step of arranging the SiC single crystal and the SiC material so as to face each other and performing heating so that the SiC single crystal is on the high temperature side and the SiC material is on the low temperature side.

As described above, by etching a SiC single crystal with a temperature gradient as a driving force, a SiC seed crystal with a reduced strained layer can be obtained.

In a preferred mode of the present invention, the planarization step includes a step of arranging a SiC single crystal and a SiC material so as to face each other, and performing heating so as to form a temperature gradient between the SiC single crystal and the SiC material in a SiC—Si equilibrium vapor pressure environment.

As described above, by performing heating so as to form a temperature gradient between the SiC single crystal and the SiC material in the SiC—Si equilibrium vapor pressure environment, a SiC seed crystal having a surface with a reduced macro-step bunching can be obtained.

In a preferred mode of the present invention, the planarization step includes a step of arranging a SiC single crystal and a SiC material so as to face each other in a semi-closed space having an atomic number ratio Si/C of greater than 1, and performing heating so as to form a temperature gradient between the SiC single crystal and the SiC material.

As described above, by arranging the SiC single crystal and the SiC material in the semi-closed space having the atomic number ratio Si/C of greater than 1, and performing heating so that the temperature gradient is formed between the SiC single crystal and the SiC material, a SiC seed crystal having a surface with reduced macro-step bunching can be obtained.

In a preferred mode of the present invention, the planarization step includes a step of accommodating a SiC single crystal and a Si vapor supply source in a main container made of a SiC material and performing heating so as to form a temperature gradient in the main container.

As described above, by accommodating the SiC single crystal and the Si vapor supply source in the main container made of the SiC material and performing heating, a SiC seed crystal having a surface with reduced macro-step bunching can be easily obtained.

In a preferred mode of the present invention, the planarization step includes a step of arranging a SiC single crystal and a SiC material so as to face each other, and performing heating so that the SiC single crystal is on a high temperature side and the SiC material is on a low temperature side in a SiC—Si equilibrium vapor pressure environment.

As described above, by etching the SiC single crystal in the SiC—Si equilibrium vapor pressure environment, a SiC seed crystal having a surface with reduced macro-step bunching can be obtained (etching planarization step).

In a preferred mode of the present invention, the planarization step includes a step of arranging a SiC single crystal and a SiC material so as to face each other in a semi-closed space having an atomic number ratio Si/C of greater than 1, and performing heating so that the SiC single crystal is on a high temperature side and the SiC material is on a low temperature side.

As described above, by arranging and etching the SiC single crystal in the semi-closed space having the atomic number ratio Si/C of equal to or greater than 1, a SiC seed crystal having a surface with reduced macro-step bunching can be obtained (etching planarization step).

In a preferred mode of the present invention, the planarization step includes a step of arranging a SiC single crystal and a SiC material so as to face each other, and performing heating so that the SiC single crystal is on a low temperature side and the SiC material is on a high temperature side in a SiC—Si equilibrium vapor pressure environment.

As described above, by growing the SiC single crystal in the SiC—Si equilibrium vapor pressure environment, a SiC seed crystal having a growth layer with reduced macro-step bunching can be obtained (growth planarization step).

In a preferred mode of the present invention, the planarization step includes a step of arranging a SiC single crystal and a SiC material so as to face each other in a semi-closed space having an atomic number ratio Si/C of greater than 1, and performing heating so that the SiC single crystal is on a low temperature side and the SiC material is on a high temperature side.

As described above, by arranging the SiC single crystal in the semi-closed space having the atomic number ratio Si/C of equal to or greater than 1 and growing the SiC single crystal, a SiC seed crystal having a growth layer with reduced macro-step bunching can be obtained (growth planarization step).

In a preferred mode of the present invention, the basal plane dislocation reduction step is a step of arranging a SiC single crystal and a SiC material so as to face each other, and performing heating so that the SiC single crystal is on a low temperature side and the SiC material is on a high temperature side in a SiC—C equilibrium vapor pressure environment.

As described above, by growing the SiC single crystal in the SiC—C equilibrium vapor pressure environment, basal plane dislocation can be converted into other dislocations with high efficiency. This makes it possible to produce a SiC seed crystal having a surface on which basal plane dislocation are not exposed.

In a preferred mode of the present invention, the basal plane dislocation reduction step is a step of arranging a SiC single crystal and a SiC material in a semi-closed space having an atomic number ratio Si/C of equal to or less than 1 so that the SiC single crystal and the SiC material face each other, and performing heating so that the SiC single crystal is on a low temperature side and the SiC material is on a high temperature side.

As described above, by arranging the SiC single crystal in the space where the atomic number ratio Si/C is equal to or less than 1, and growing the SiC single crystal, it is possible to convert the basal plane dislocation into other dislocations with high efficiency. This makes it possible to produce a SiC seed crystal having a preferable surface on which basal plane dislocation are not exposed.

The present invention also relates to a SiC seed crystal for the growth of a SiC ingot produced by the above-mentioned production method.

The SiC seed crystal of the present invention have a preferable surface with at least one or more of strain, basal plane dislocation or macro-step bunching reduced. Therefore, a high-quality SiC ingot can be produced by growing the SiC seed crystal of the present invention.

The present invention also relates to a SiC seed crystal for growth of a SiC ingot including a layer not including basal plane dislocation on a surface.

Basal plane dislocation is known to be detrimental to SiC semiconductor devices. Since the SiC seed crystal of the present invention has a growth layer not including basal plane dislocation on its surface, basal plane dislocation do not propagate in the SiC ingot in the ingot growth step, which is a succeeding step.

In a preferred mode of the present invention, the SiC seed crystal has a diameter of six inches or more.

The present invention also relates to a method for producing a SiC ingot, the method including an ingot growth step of performing crystal growth of a single crystal SiC on the above-mentioned SiC seed crystal.

Since the above-mentioned SiC seed crystal has a preferable surface with reduced strain, basal plane dislocation or macro-step bunching, a high quality SiC ingot can be produced.

The present invention also relates to a SiC ingot produced by the above-mentioned production method.

The present invention also relates to a method for producing a SiC wafer, the method including a slicing step of cutting out a SiC wafer from the above-mentioned SiC ingot so as to expose a grown surface.

The present invention also relates to a SiC wafer produced by the above-mentioned production method.

The present invention also relates to a method for producing a SiC wafer with an epitaxial film, the method including an epitaxial growth step of forming an epitaxial film on the grown surface of the above-mentioned SiC wafer.

Advantageous Effects of Invention

According to the present invention, it is possible to produce a SiC seed crystal having a preferable surface in which at least one or more of strain, basal plane dislocation or macro-step bunching are reduced. Along with this, according to the present invention, it is possible to provide high-quality SiC ingot, SiC wafer, and SiC wafer with an epitaxial film.

Other issues, features and advantages will become apparent by reading the description of embodiments described below as taken up with the drawings and the claims.

DESCRIPTION OF EMBODIMENTS

<1> Summary of Invention

Hereinafter, preferred embodiments of the present invention will be described in detail with reference to the drawings. The technical scope of the present invention is not limited to the embodiments illustrated in the accompanying drawings, and can be appropriately changed within the scope described in the claims.

First, with reference to FIG. 1, an outline of an embodiment in the case of producing a SiC seed crystal 11, a SiC ingot 12, a SiC wafer 13, and a SiC wafer with epitaxial film 14 by the method of the present invention will be described.

Figure 1:
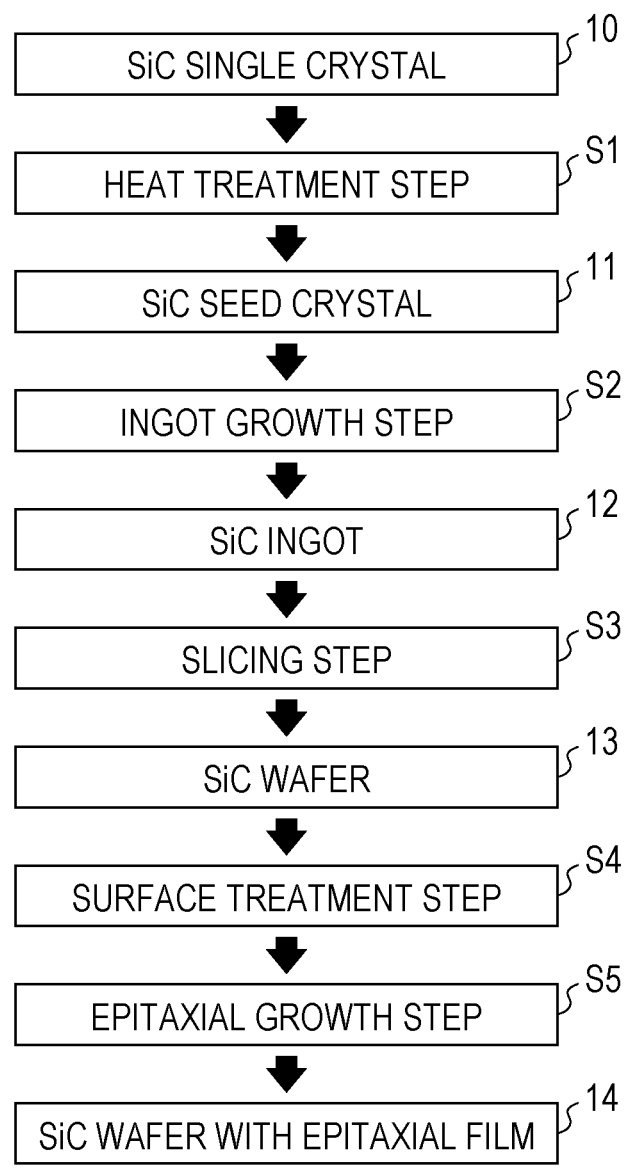
FIG. 1 is a schematic diagram of a production step of a SiC wafer with an epitaxial film of an embodiment.

A feature of the present invention is to obtain the high-quality SiC seed crystal 11 by performing a heat treatment step S1 on a SiC single crystal 10 (FIG. 1). By performing the heat treatment step S1 on the SiC single crystal 10, it is possible to obtain the high-quality SiC seed crystal 11 in which strain (strained layer 101), basal plane dislocation (BPD), and macro-step bunching (MSB) are removed or reduced.

The term "SiC single crystal" in the present specification broadly includes a single crystal SiC in a state before being subjected to an ingot growth step S2 as the SiC seed crystal 11. The term "SiC single crystal" does not specifically refer to a single crystal SiC in a particular state.

In the SiC seed crystal 11 after the heat treatment step S1, at least one or more of strain, BPD and MSB is removed or reduced, and the SiC seed crystal 11 is suitable for growing a high-quality SiC ingot. In the present invention, by performing the ingot growth step S2 of growing a single crystal SiC on the SiC seed crystal 11, the high-quality SiC ingot 12 can be obtained (see FIG. 1).

In the SiC ingot 12 thus obtained, the inheritance of defects caused by strain, BPD, MSB, and the like existing in the SiC single crystal 10 is suppressed. Therefore, the SiC wafer 13 cut out from here by a slicing step S3 is also of high quality (see FIG. 1).

In general, when a BPD exists on the surface of a SiC wafer, the BPD can be propagated to an epitaxial film formed by epitaxially growing the SiC wafer. However, in the present invention, strain and BPD are not exposed on the surface of the SiC wafer 13. Therefore, it is possible to suppress the propagation of a BPD to the epitaxial film formed on the SiC wafer 13. That is, according to the present invention, it is possible to produce the SiC wafer with epitaxial film 14 capable of producing a high-performance SiC semiconductor device (see FIG. 1).

Hereinafter, each configuration of the present invention will be described in more detail.

<2> SiC Single Crystal 10

Examples of the SiC single crystal 10 include a SiC substrate obtained by processing a single crystal SiC into a thin plate. Specifically, the examples include a SiC wafer or the like obtained by slicing a SiC ingot produce by a sublimation method or the like into a disk shape. As the crystal polymorphism of single crystal SiC, any polytype can be adopted.

Figure 8:
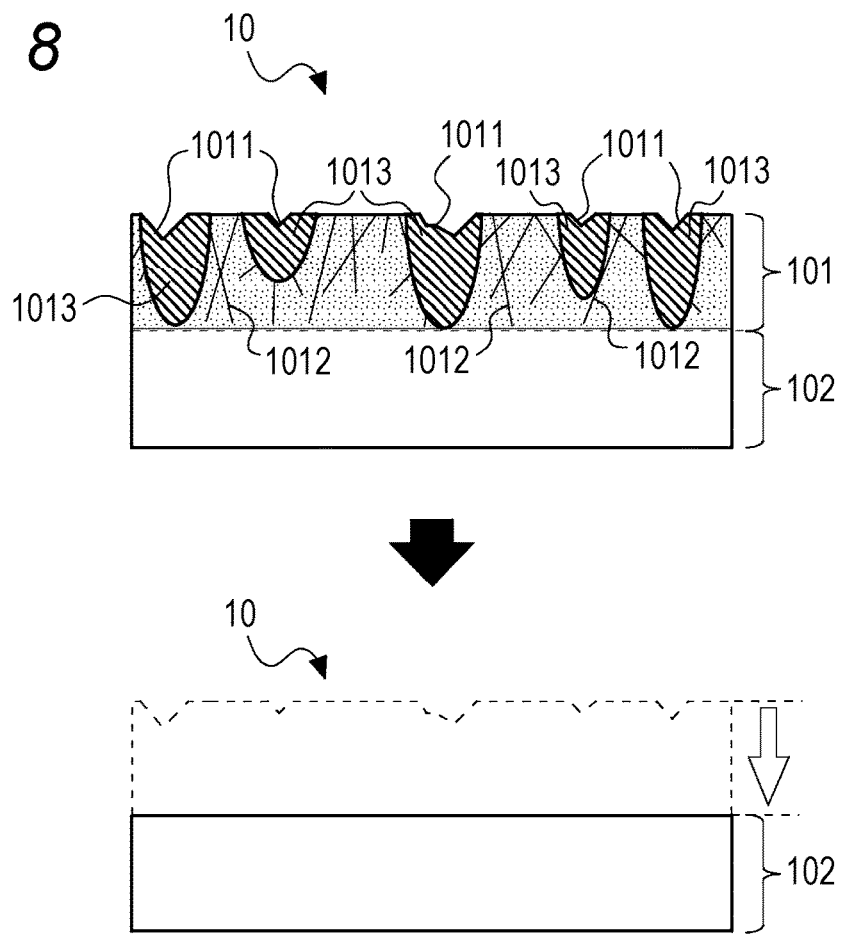
FIG. 8 is a diagram illustrating an outline of a strained layer removal step.

In general, the SiC single crystal 10 that has been subjected to mechanical processing (for example, slicing or grinding and polishing) or laser processing includes a strained layer 101 in which subsurface damage such as a scratch 1011, a latent scratch 1012, and strain 1013 has been introduced, and a bulk layer 102 in which no such subsurface damage has been introduced (see FIG. 8).

The presence or absence of this strained layer 101 can be checked by the SEM-EBSD method, TEM, pXRD, Raman spectroscopy, or the like. In order to grow a high-quality SiC ingot, it is preferable to remove the strained layer 101 to expose the bulk layer 102 to which no subsurface damage has been introduced.

A step-terrace structure is confirmed on the surface of the SiC single crystal 10 planarized at the atomic level. This step-terrace structure is a staircase structure in which a step 103 that is a stepped portion of one or more molecular layers, and a terrace 104, that is a flat portion where a {0001} surface is exposed are alternately arranged (see FIGS. 10 and 12).

In the step 103, one molecular layer (0.25 nm) is the minimum height (minimum unit), and various step heights are formed by overlapping a plurality of the single molecular layers.

In the description of the present specification, the step 103 that has become huge by bunching and has a height exceeding one unit cell of each polytype is referred to as MSB.

That is, the MSB refers to a step 103 obtained by bunching of greater than four molecular layers (equal to or greater than five molecular layers) in the case of 4H—SiC. In the case of 6H—SiC, MSB refers to a step 103 obtained by bunching of greater than six molecular layers (equal to or greater than seven molecular layers).

If a defect caused by the MSB is inherited by the SiC ingot, the defect will lead to deterioration of the performance of the SiC semiconductor device. Therefore, it is desirable that MSB is not formed on the surface of the SiC seed crystal 11.

<3> Heat Treatment Step S1

The heat treatment step S1 is a step of heat-treating the SiC single crystal 10 in an atmosphere containing Si element and C element. The SiC seed crystal 11 that has been subjected to the heat treatment step S1 has a surface in which at least one or more of strain (strained layer 101), BPD, and MSB is reduced. Therefore, in the ingot growth step S2, which is a succeeding step, it is possible to prevent defects caused by strain, BPD, and MSB of the SiC seed crystal 11 from being inherited by the SiC ingot 12. That is, a high-quality SiC ingot 12 can be produced.

Specifically, examples of the heat treatment step S1 include a mode in which the SiC single crystal 10 and the SiC material are heated so as to face each other. That is, the heat treatment step S1 may include: an etching step of transporting the Si element and the C element from the SiC single crystal 10 to a SiC material to etch the SiC single crystal 10; and a crystal growth step of transporting the Si element and the C element from the SiC material to the SiC single crystal 10 to grow the SiC single crystal 10.

The specific aspect of the heat treatment step S1 is not particularly limited as long as it is a step in which the strained layer 101, the BPD, and the MSB included in the SiC single crystal 10 can be removed or reduced.

As the driving force for transporting the Si element and the C element in the etching step and the crystal growth step, a temperature gradient and a chemical potential difference between the SiC single crystal 10 and the SiC material can be adopted.

The SiC material is composed of SiC that can receive or transfer Si element and C element to and from the SiC single crystal 10 by heating the SiC material so as to face the SiC single crystal 10. For example, a SiC container (main container 20) or a SiC substrate (SiC member) can be adopted. As the crystal polymorph of SiC material, any polytype can be adopted, and polycrystalline SiC may be adopted.

The SiC single crystal 10 and the SiC material are preferably arranged in a semi-closed space and heated. By receiving or transferring Si element and C element in a semi-closed space, a surface in which at least one or more of the strained layer 101, the BPD and the MSB is reduced by etching and growing the surface of the SiC single crystal 10.

The "semi-closed space" in the present specification refers to a space in which at least part of steam generated in the container can be confined, although the inside of the container can be evacuated.

Hereinafter, a preferable mode of the heat treatment step S1 will be described in detail with reference to FIGS. 2 to 4.

Figure 2:
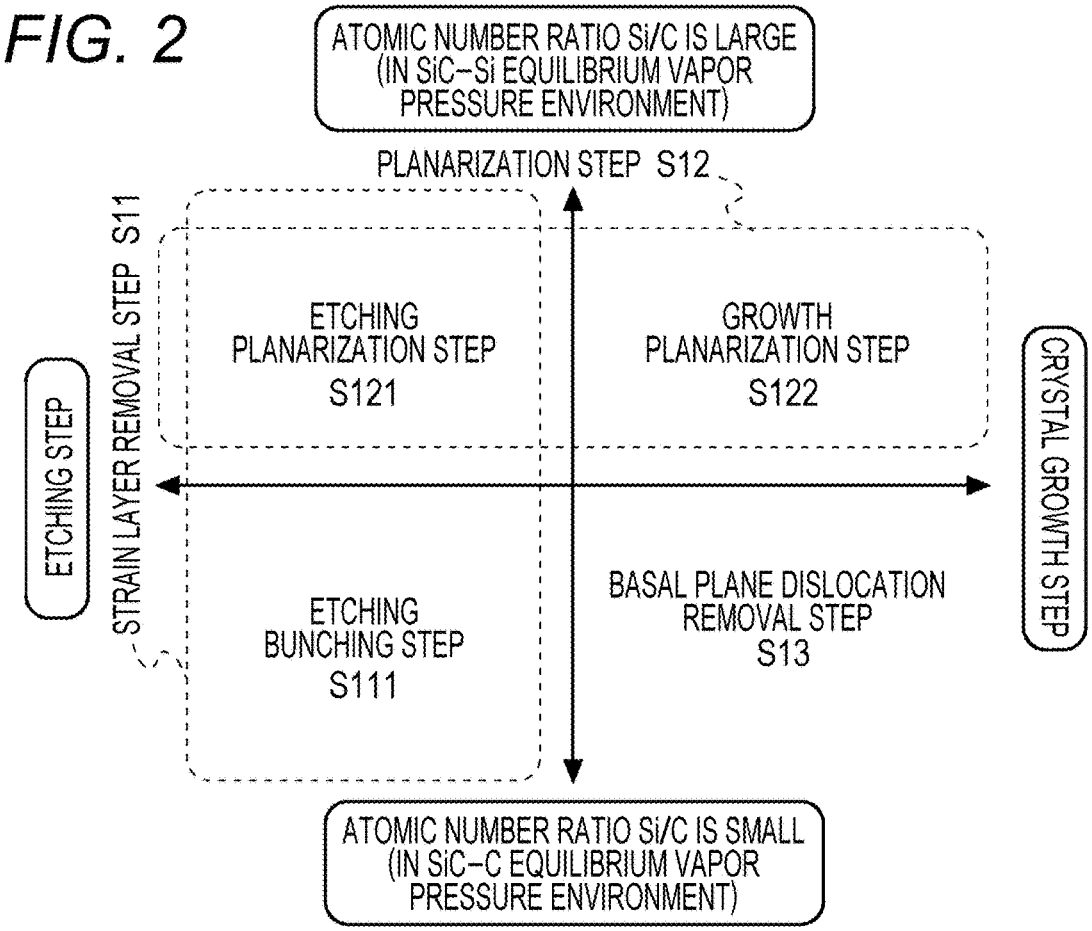
FIG. 2 is a conceptual diagram illustrating a preferred mode of a heat treatment step of the present invention.

The preferred aspect of the heat treatment step S1 can be roughly divided into an etching step of etching the surface of the SiC single crystal 10 and a crystal growth step of growing a single crystal SiC on the SiC single crystal 10 (see FIG. 2).

(Etching Step)

According to the etching step (the step on the left side of FIG. 2), the strained layer 101 and the MSB existing on the surface of the SiC single crystal 10 can be removed or reduced.

Figure 3:
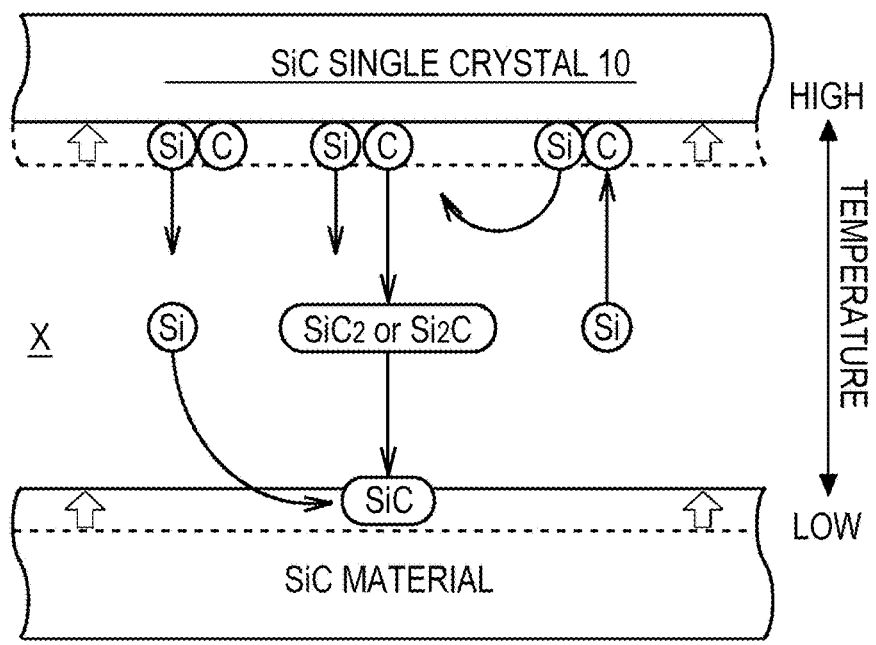
FIG. 3 is an explanatory diagram illustrating an outline of an etching mechanism of the heat treatment step of the present invention.

FIG. 3 is an explanatory diagram illustrating an outline of the etching step. In this etching step, it is considered that, by arranging the SiC single crystal 10 in a semi-closed space where the SiC material is exposed, and performing heating in a temperature range of 1400° C. or higher and 2300° C. or lower, the reactions 1) to 5) below are performed continuously, and as a result, the etching proceeds.

$$SiC(s) \rightarrow Si(v)+C(s) \quad 1)$$

$$2C(s)+Si(v) \rightarrow SiC_2(v) \quad 2)$$

$$C(s)+2Si(v) \rightarrow Si_2C(v) \quad 3)$$

$$Si(v)+SiC_2(v) \rightarrow 2SiC(s) \quad 4)$$

$$Si_2C(v) \rightarrow Si(v)+SiC(s) \quad 5)$$

Explanation of 1): When the SiC single crystal 10 (SiC(s)) is heated, Si atoms (Si(v)) are desorbed from the surface of SiC single crystal 10 by thermal decomposition (Si atom sublimation step).

Explanation of 2) and 3): C (C(s)) remaining on the surface of the SiC single crystal 10 due to the desorption of Si atom (Si(v)) reacts with Si vapor (Si(v)) in the semi-closed space. As a result, C (C(s)) becomes $Si_2C$, $SiC_2$, or the like and sublimates from the surface of the SiC single crystal 10 (C atom sublimation step).

Explanation of 4) and 5): Sublimated $Si_2C$, $SiC_2$, or the like reaches the SiC material in the semi-closed space and grows due to the temperature gradient.

As described above, the etching step includes: a Si atom sublimation step of thermally sublimating the Si atom from the surface of the SiC single crystal 10; and a C atom sublimation step of causing the C atom remaining on the surface of the SiC single crystal 10 to react with the Si vapor in the semi-closed space to sublimate the C atom from the surface of the SiC single crystal 10.

Preferably, the etching step performs performing heating so that the SiC single crystal 10 is on the high temperature side of the temperature gradient and the SiC material is on the low temperature side of the temperature gradient. As a result, an etching space X is formed between the SiC single crystal 10 and the SiC material, and the surface of the SiC single crystal 10 can be etched using the temperature gradient as a driving force.

(Crystal Growth Step)

According to the crystal growth step (step on the right side of FIG. 2), BPD existing on the surface of the SiC single crystal 10 can be converted into other dislocations so that the BPD exposed on the surface of the SiC seed crystal 11 is removed or reduced.

In addition, MSB on the surface of the SiC seed crystal 11 can be removed or reduced.

Figure 4:
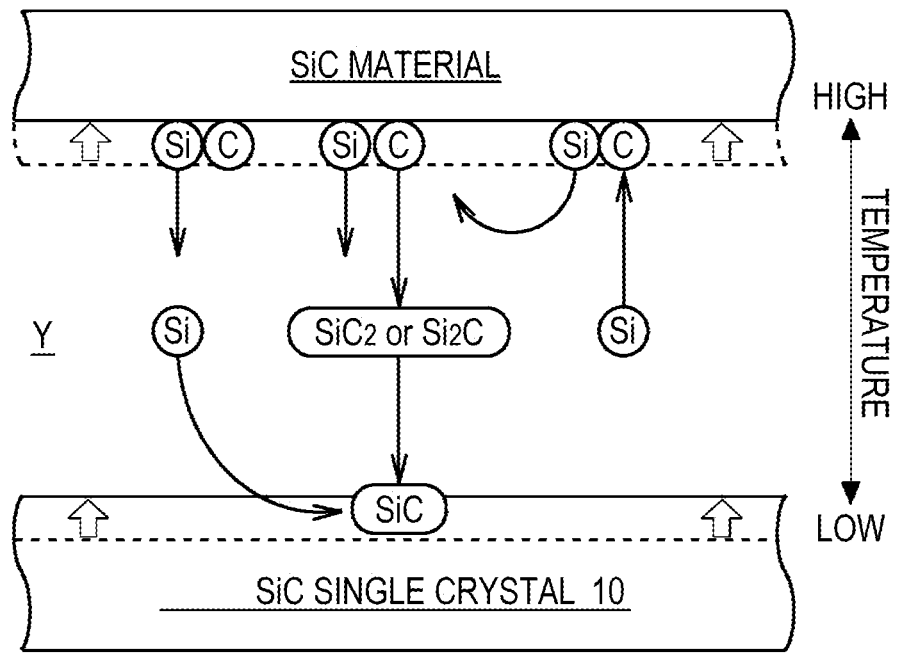
FIG. 4 is an explanatory diagram illustrating an outline of a growth mechanism of the heat treatment step of the present invention.

FIG. 4 is an explanatory diagram illustrating an outline of the crystal growth step. In this crystal growth step, it is considered that, by arranging the SiC single crystal 10 in a semi-closed space where the SiC material is exposed, and performing heating in a temperature range of 1400° C. or higher and 2300° C. or lower, the reactions 1) to 5) below are performed continuously, and as a result, the crystal growth proceeds.

$$SiC(s) \rightarrow Si(v)+C(s) \quad 1)$$

$$2C(s)+Si(v) \rightarrow SiC_2(v) \quad 2)$$

$$C(s)+2Si(v) \rightarrow Si_2C(v) \quad 3)$$

$$Si(v)+SiC_2(v) \rightarrow 2SiC(s) \quad 4)$$

$$Si_2C(v) \rightarrow Si(v)+SiC(s) \quad 5)$$

Explanation of 1): When the SiC material (Poly-SiC(s)) is heated, Si atoms (Si(v)) are desorbed from SiC by thermal decomposition.

Explanation of 2) and 3): C (C(s)) remaining due to the desorption of Si atom (Si(v)) reacts with Si vapor (Si(v)) in the semi-closed space. As a result, C (C(s)) becomes $Si_2C$, $SiC_2$, or the like and sublimates into the semi-closed space.

Explanation of 4) and 5): Sublimated $Si_2C$, $SiC_2$, or the like reaches and diffuses to the terrace of SiC single crystal 10 due to the temperature gradient (or chemical potential difference), and reaches the step to grow while inheriting the polymorphisms of the SiC single crystal 10 that is a base (step flow growth).

As described above, the crystal growth step includes: a Si atom sublimation step of thermally sublimating the Si atom from the surface of the SiC material; a C atom sublimation step of sublimating the C atom remaining on the surface of the SiC material by causing the C atom to react with the Si vapor in the semi-closed space; a source material transporting step of transporting the source material (Si atom and C atom) to the surface of the SiC single crystal 10 using the temperature gradient or the chemical potential difference as the driving force; and a step flow growth step in which the source material reaches the step of the SiC single crystal 10 to grow.

Preferably, the crystal growth step performs performing heating so that the SiC material is on the high temperature side of the temperature gradient and the SiC single crystal 10 is on the low temperature side of the temperature gradient. As a result, a source material supply space Y is formed between the SiC single crystal 10 and the SiC material, and the SiC single crystal 10 can be grown by using the temperature gradient as a driving force.

When a single crystal SiC is used for the SiC single crystal 10 and a polycrystalline SiC is used for the SiC material, crystal growth can be performed by using a partial pressure difference (chemical potential difference) generated on the surface of the polycrystalline SiC and the single crystal SiC as a driving force of transportation of a source material. In this case, a temperature gradient may or may not be provided.

So far, the heat treatment step S1 has been described by roughly dividing the heat treatment step S1 into the etching step and the crystal growth step. However, the heat treatment step S1 can be classified into two types from the viewpoint of the environment in which the SiC single crystal 10 is heated.

That is, as illustrated separately in the vertical direction in FIG. 2, the heat treatment step S1 can be classified into a mode of heating the SiC single crystal 10 in a SiC—Si equilibrium vapor pressure environment, and a mode of heating the SiC single crystal 10 in a SiC—C equilibrium vapor pressure environment.

Here, the SiC—Si equilibrium vapor pressure environment refers to the vapor pressure environment when SiC (solid) and Si (liquid phase) are in a phase equilibrium state via a gas phase.

The SiC—C equilibrium vapor pressure environment refers to the vapor pressure environment when SiC (solid phase) and C (solid phase) are in a phase equilibrium state via a gas phase.

The SiC—Si equilibrium vapor pressure environment and the SiC—C equilibrium vapor pressure environment in the present specification include a near-thermal equilibrium vapor pressure environment that satisfies the relationship between the growth rate and the growth temperature derived from the theoretical thermal equilibrium environment.

The atomic number ratio Si/C in the gas phase of the SiC—Si equilibrium vapor pressure environment is larger than the atomic number ratio Si/C in the gas phase of the SiC—C equilibrium vapor pressure environment.

The SiC—Si equilibrium vapor pressure environment can be formed by arranging the SiC single crystal 10 in a semi-closed space having an atomic number ratio Si/C of greater than 1 and heating the SiC single crystal 10. For example, the SiC single crystal 10 satisfying a stoichiometric ratio 1:1, a SiC material satisfying a stoichiometric ratio 1:1, and a Si vapor supply source (Si pellet or the like) are arranged in a container (main container 20) made of SiC satisfying a stoichiometric ratio 1:1, the atomic number ratio Si/C in the semi-closed space exceeds 1.

On the other hand, the SiC—C equilibrium vapor pressure environment can be formed by arranging the SiC single crystal 10 in a semi-closed space having an atomic number ratio Si/C of equal to or less than 1 and heating the SiC single crystal 10. For example, the SiC single crystal 10 satisfying a stoichiometric ratio 1:1 and a SiC material satisfying a stoichiometric ratio 1:1 are arranged in a container (main container 20) made of SiC satisfying a stoichiometric ratio 1:1, the atomic number ratio Si/C in the main container 20 is 1. A C vapor supply source (C pellet or the like) may be arranged to set the atomic number ratio Si/C to equal to or less than 1.

As described above, the heat treatment step S1 can be classified from the viewpoint of (1) whether the step is an etching step or a crystal growth step, (2) whether a heat treatment is performed under a SiC—Si equilibrium vapor pressure environment or a SiC—C equilibrium vapor pressure environment. By associating this combination of classifications with effects, the heat treatment step S1 can be classified into the following four types.

In the form in which the etching step is performed in a SiC—C equilibrium vapor pressure environment, the strained layer 101 of the SiC single crystal 10 can be removed by etching, and MSB is formed on the surface after etching. Therefore, the heat treatment step S1 is classified as an etching bunching step S111 (lower left in FIG. 2).

In the aspect in which the etching step is performed in a SiC—Si equilibrium vapor pressure environment, the strained layer 101 of the SiC single crystal 10 can be removed by etching, and MSB is not formed on the surface after etching. Therefore, the heat treatment step S1 is classified as an etching planarization step S121 (upper left in FIG. 2).

Since it is possible to remove or reduce the strained layer 101 of the SiC single crystal 10 in the etching bunching step S111 and the etching planarization step S121, they are collectively classified as a strained layer removal step S11 (left side in FIG. 2).

In a mode in which the crystal growth step is performed in a SiC—Si equilibrium vapor pressure environment, it is possible to form a growth layer 105 on which the MSB is reduced or removed on the SiC single crystal 10. Therefore, the heat treatment step S1 is classified as a growth planarization step S122 (upper right of FIG. 2).

Since it is possible to remove or reduce MSB in the etching planarization step S121 and the growth planarization step S122, they are collectively classified as a planarization step S12 (upper side in FIG. 2).

In the mode of performing the crystal growth step in a SiC—C equilibrium vapor pressure environment, it is possible to remove or reduce BPD in the growth layer 105. Therefore, the treatment step S1 is classified as the basal plane dislocation reduction step S13 (lower right in FIG. 2).

(Production Apparatus)

Next, a mode of a production apparatus capable of achieving the above-mentioned four types of classification will be described.

Hereinafter, as a preferred embodiment, a mode of using the main container 20 capable of heat-treating the SiC single crystal 10 in an atmosphere containing Si element and C element will be described. Any apparatus configuration that forms an environment similar to that of the main container 20 can be naturally adopted. Specifically, any apparatus configuration capable of forming an atmosphere of Si element and C element in the semi-closed space can be adopted.

The main container 20 preferably has a configuration in which the SiC material is exposed in the internal space. In the present embodiment, the entire main container 20 is made of a SiC material (polycrystalline SiC). By heating the main container 20 made of such a material, an atmosphere containing Si element and C element can be generated inside (semi-closed space).

It is desirable that the environment inside the heat-treated main container 20 is a vapor pressure environment of a mixed system of gas phase species containing Si element and gas phase species containing C element. Examples of the gas phase species containing the Si element include Si, $Si_2$, $Si_3$, $Si_2C$, $SiC_2$, and SiC. Examples of the gas phase species containing the C element include $Si_2C$, $SiC_2$, SiC, and C. That is, the gas of SiC group exists in the main container 20.

A configuration can be adopted as long as the configuration generates a vapor pressure of the gas phase species containing the Si element and the gas phase species containing the C element in the internal space at the time of the heat treatment of the main container 20. For example, a configuration in which the SiC material is exposed on a part of the inner surface, or a configuration in which the SiC material (such as a SiC substrate) is separately arranged in the main container 20 can be noted.

In the heat treatment step S1, it is preferable that the SiC single crystal 10 is accommodated inside the main container 20 and the main container 20 is heated so as to form a temperature gradient inside. Hereinafter, an apparatus configuration (main container 20, heating furnace 30, refractory container 40) in the case of heating the main container 20 so as to form a temperature gradient inside will be described with reference to FIGS. 5 and 6.

Figure 5:
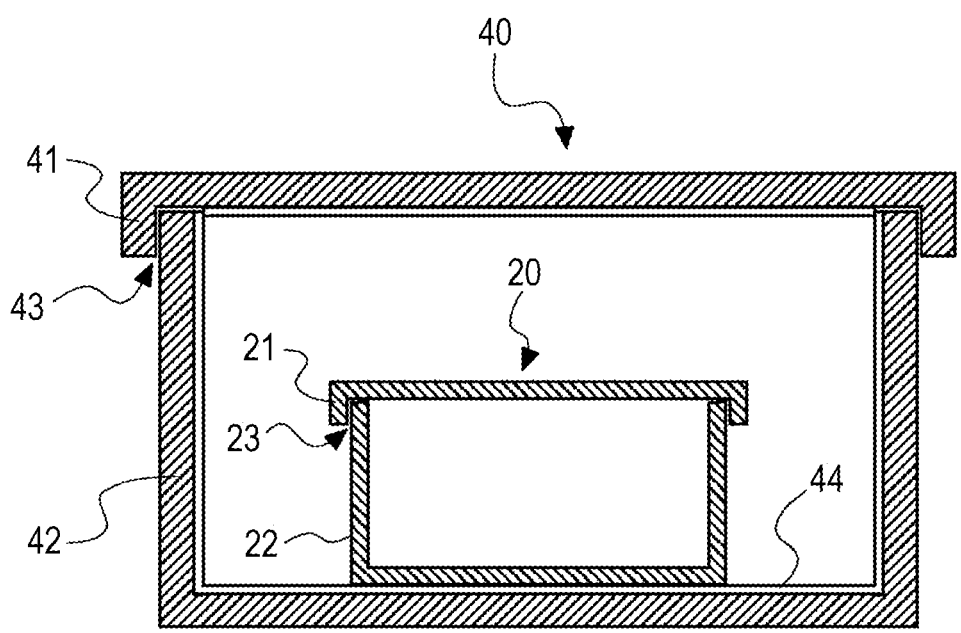
FIG. 5 is a schematic diagram of a main container and a refractory container of an embodiment.

As illustrated in FIG. 5, the main container 20 is a fitting container including an upper container 21 and a lower container 22 that can be fitted to each other. A minute gap 23 is formed in a fitting portion between the upper container 21 and the lower container 22, and the main container 20 is configured so that air exhausting (evacuation) in the main container 20 can be performed from this gap 23. That is, the inside of the main container 20 is a semi-closed space.

Figure 6:
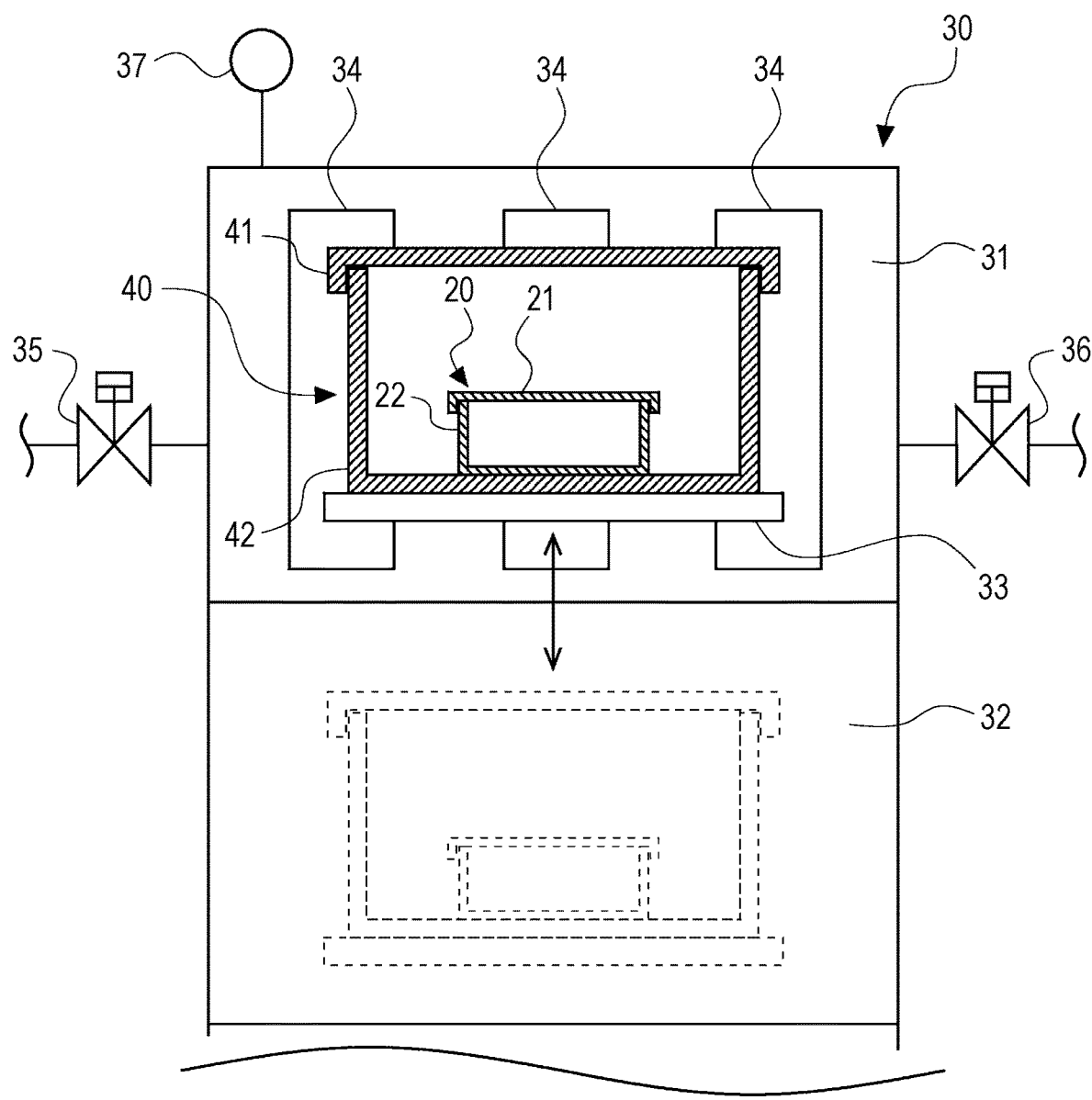
FIG. 6 is an explanatory diagram of an apparatus for producing a SiC seed crystal of an embodiment.

The heating furnace 30 has a configuration in which the main container 20 can be heated by providing a temperature gradient in an atmosphere containing Si element. Specifically, as illustrated in FIG. 6, the heating furnace 30 includes: a main heating chamber 31 capable of heating an object to be treated (SiC single crystal 10 or the like) to a temperature of equal to or higher than 1000° C. and equal to or less than 2300° C.; a preheating chamber 32 capable of preheating the object to be treated to a temperature of equal to or higher than 500° C.; a refractory container 40 capable of accommodating the main container 20; and moving means 33 (moving table) capable of moving the refractory container 40 from the preheating chamber 32 to the main heating chamber 31.

The main heating chamber 31 is formed in a regular hexagonal shape in a plan sectional view, and the refractory container 40 is arranged inside the heating chamber 31.

A heater 34 (mesh heater) is provided inside the main heating chamber 31. A multilayer heat-reflecting metal plate is fixed to a side wall and ceiling of the main heating chamber 31 (not illustrated). This multilayer heat-reflecting metal plate is configured to reflect the heat of the heater 34 toward a substantially central portion of the main heating chamber 31.

As a result, in the main heating chamber 31, the heater 34 is arranged so as to surround the refractory container 40 accommodating the object to be treated, and further, the multilayer heat-reflecting metal plate is arranged outside the heater 34, so that the temperature can be raised to equal to or higher than 1000° C. and equal to or less than 2300° C.

As the heater 34, for example, a resistance heating type heater or a high frequency induction heating type heater can be used.

As a configuration of the heater 34, a configuration capable of forming a temperature gradient in the refractory container 40 may be adopted. For example, the heater 34 may be configured so that many heaters are arranged on the upper side (or the lower side). Further, the heater 34 may be configured so that the width increases toward the upper side (or the lower side). Alternatively, the heater 34 may be configured so that the electric power supplied can be increased toward the upper side (or the lower side).

To the main heating chamber 31, a vacuum forming valve 35 that performs air exhausting in the main heating chamber 31, an inert gas injection valve 36 that introduces an inert gas into the main heating chamber 31, a vacuum gauge 37 that measures the degree of vacuum in the main heating chamber 31 are connected.

The vacuum forming valve 35 is connected to an evacuation pump that exhausts and evacuates the inside of the main heating chamber 31 (not illustrated). With the vacuum forming valve 35 and the evacuation pump, the degree of vacuum in the main heating chamber 31 can be adjusted to, for example, equal to or less than 10 Pa, more preferably equal to or less than 1 Pa, still more preferably equal to or less than $10^{-3}$ Pa. Examples of this evacuation pump include a turbo molecular pump.

The inert gas injection valve 36 is connected to an inert gas supply source (not illustrated). With the inert gas injection valve 36 and the inert gas supply source, inert gas can be introduced into the main heating chamber 31 in the range of $10^{-3}$ to 10000 Pa. As this inert gas, Ar, He, $N_2$ and the like can be selected.

The preheating chamber 32 is connected to the main heating chamber 31, and is configured so the refractory container 40 can be moved by the moving means 33. The preheating chamber 32 of the present embodiment is configured so that the temperature can be raised by the residual heat of the heater 34 of the main heating chamber 31. For example, when the temperature of the main heating chamber 31 is raised to 2000° C., the temperature of the preheating chamber 32 is raised to about 1000° C., and the object to be treated (SiC single crystal 10, main container 20, refractory container 40, or the like) can be degassed.

The moving means 33 is configured to be movable between the main heating chamber 31 and the preheating chamber 32 on which the refractory container 40 is placed. Since the transportation between the main heating chamber 31 and the preheating chamber 32 by the moving means 33 is completed in about one minute at the shortest, it is possible to raise or lower the temperature at 1 to 1000° C./min.

As described above, since this production apparatus can rapidly raise and lower the temperature, it is possible to observe a surface shape that does not have a history of low-temperature growth during raising and lowering, which is difficult with conventional apparatuses.

In FIG. 6, the preheating chamber 32 is arranged below the main heating chamber 31, but the present invention is not limited to this, and the preheating chamber 32 may be arranged in any direction.

The moving means 33 according to the present embodiment is a moving table on which the refractory container 40 is placed. A small amount of heat is released from the contact portion between the moving table and the refractory container 40. As a result, a temperature gradient can be formed in the refractory container 40.

In the heating furnace 30 of the present embodiment, since the bottom of the refractory container 40 is in contact with the moving table, a temperature gradient is provided so that the temperature decreases from the upper container 41 to the lower container 42 of the refractory container 40.

The direction of this temperature gradient can be set to any direction by changing the position of the contact portion between the moving table and the refractory container 40. For example, when a hanging type or the like is adopted for the moving table and the contact portion is provided on the ceiling of the refractory container 40, heat escapes upward. Therefore, the temperature gradient is provided so that the temperature rises from the upper container 41 to the lower container 42 of the refractory container 40. It is desirable that this temperature gradient is formed along the front and back direction of the SiC single crystal 10.

As described above, a temperature gradient may be formed depending on the configuration of the heater 34.

The atmosphere containing the Si element in the heating furnace 30 is formed by using the refractory container 40 and the Si vapor supply source 44. For example, any method capable of forming an atmosphere containing Si element around the main container 20 can be adopted in the apparatus for producing the SiC seed crystal 11.

The refractory container 40 includes a high melting point material. Examples of such high melting point material include C that is a general-purpose heat-resistant member, W, Re, Os, Ta, and Mo that are high melting point metals, $Ta_9C_8$, HfC, TaC, NbC, ZrC, $Ta_2C$, TiC, WC, and MoC that are carbides, HfN, TaN, BN, $Ta_2N$, ZrN, and TiN that are nitrides, and $HfB_2$, $TaB_2$, $ZrB_2$, $NB_2$, $TiB_2$, and polycrystalline SiC that are borides.

As similar to the main container 20, the refractory container 40 is a fitting container including an upper container 41 and a lower container 42 that can be fitted to each other, and is configured to be able to accommodate the main container 20. A minute gap 43 is formed in the fitting portion between the upper container 41 and the lower container 42, and is configured so that air exhausting (evacuation) in the refractory container 40 from this gap 43. That is, it is preferable that the inside of the refractory container 40 is a semi-closed space as in the main container 20.

The refractory container 40 has a Si vapor supply source 44 capable of supplying Si vapor in the refractory container 40. It is sufficient that the Si vapor supply source 44 is configured to generate Si vapor in the refractory container 40 during heat treatment. Examples of the Si vapor supply source 44 include solid Si (a single crystal Si piece or a Si pellet of Si powder or the like) and a Si compound.

In the apparatus for producing the SiC seed crystal 11 according to the present embodiment, TaC is used as the material of the refractory container 40, and tantalum silicide is used as the Si vapor supply source 44. That is, as illustrated in FIG. 5, a tantalum silicide layer is formed inside the refractory container 40, and Si vapor is supplied from the tantalum silicide layer into the container during heat treatment. As a result, a Si vapor pressure environment is formed in the refractory container 40, and the main container 20 can be heated in an atmosphere containing Si element.

In addition to this, any configuration can be adopted as long as an atmosphere containing Si element is formed in the refractory container 40 during heat treatment.

According to the apparatus for producing the SiC seed crystal 11 according to the present embodiment, by heating the main container 20 in an atmosphere containing Si element (for example, a Si vapor pressure environment), it is possible to suppress the exhaust of gas phase species containing the Si element from the main container 20. That is, the environment inside the main container 20 can be maintained by balancing the vapor pressure of the gas phase species containing the Si element inside the main container 20 and the vapor pressure of the gas phase species containing the Si element outside the main container 20.

According to the apparatus for producing the SiC seed crystal 11 according to the present embodiment, the main container 20 is composed of polycrystalline SiC. With such a configuration, when the main container 20 is heated by using the heating furnace 30, vapor of the gas phase species containing Si element and the gas phase species containing C element can be generated in the main container 20.

(Apparatus Configuration to Achieve Heat Treatment Step S1)

The outline of the apparatus configuration for achieving above-mentioned four classifications (etching in the SiC—C equilibrium vapor pressure environment (lower left in FIG. 2), etching in the SiC—Si equilibrium vapor pressure environment (upper left in FIG. 2), crystal growth in the SiC—C equilibrium vapor pressure environment (lower right of FIG. 2), and crystal growth in the SiC—Si equilibrium vapor pressure environment (upper right of FIG. 2)) will be described in detail with reference to FIG. 7.

Figure 7:
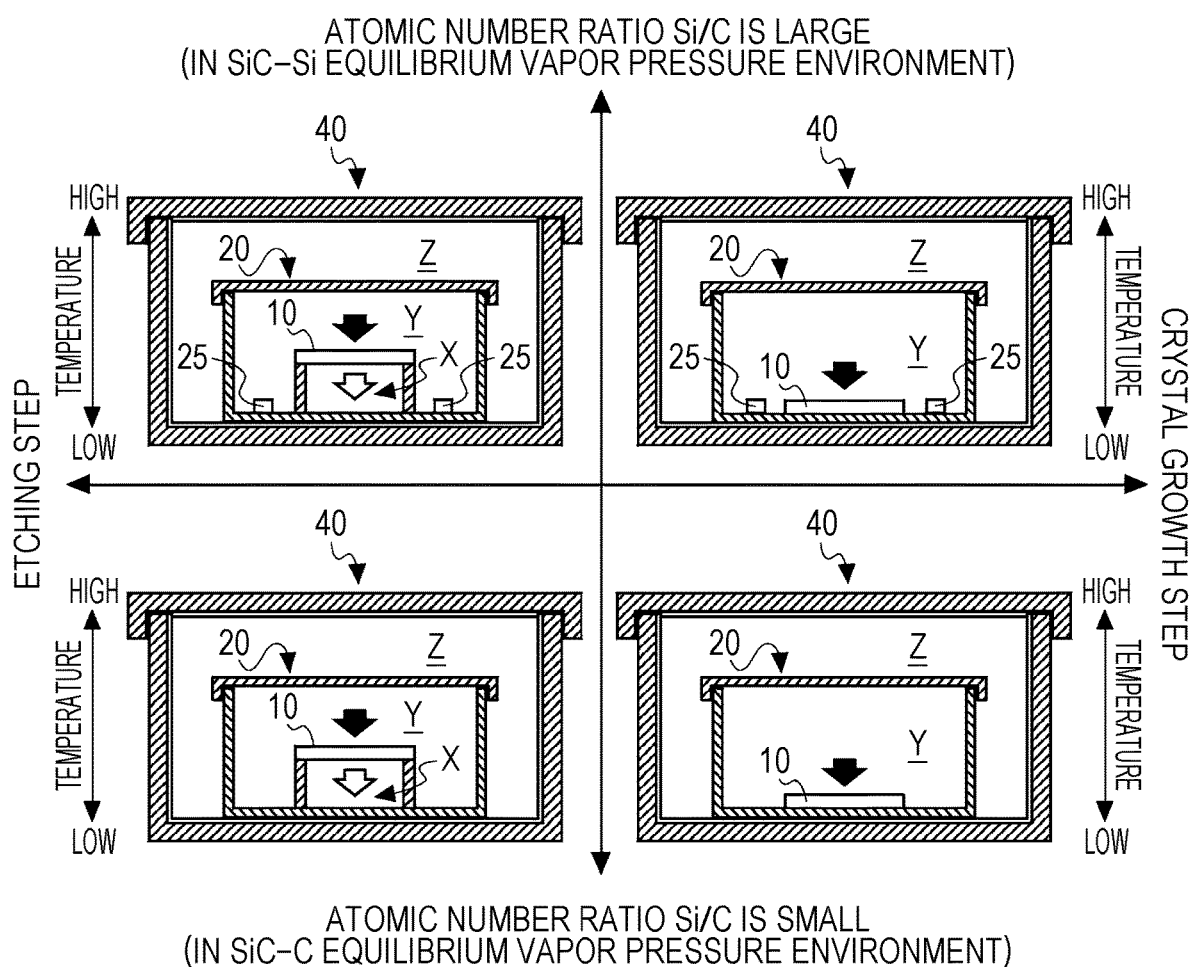
FIG. 7 is a schematic diagram illustrating a container configuration in a preferred mode of the heat treatment step of the present invention.

The outline of the apparatus configuration for achieving the etching step is illustrated on the left side in FIG. 7. As illustrated on the left side in FIG. 7, the main container 20 includes an etching space X in which the SiC single crystal 10 is on the high temperature side of the temperature gradient, and the SiC material (a part of the main container 20) is on the low temperature side of the temperature gradient. That is, the etching space X is formed by arranging the SiC single crystal 10 at a position where the temperature is higher than that of the SiC material (for example, the bottom surface of the lower container 22) due to the temperature gradient formed by the heating furnace 30.

The etching space X is a space for transporting the Si atom and the C atom on the surface of the SiC single crystal 10 to the main container 20 by using a temperature difference provided between the SiC single crystal 10 and the main container 20 as a driving force.

For example, the main container 20 is heated so that, when the temperature on the surface of the SiC single crystal 10 and the temperature on the bottom surface of the lower container 22 facing the surface of the SiC single crystal 10 are compared, the temperature on the side of the surface of the SiC single crystal 10 is higher and the temperature on the side of the bottom surface of the lower container 22 is lower (see the left side in FIG. 7). As described above, by forming a space (etching space X) with a temperature difference between the surface of the SiC single crystal 10 and the bottom surface of the lower container 22, it is possible to transport the Si atom and the C atom using the temperature difference as a driving force, and etch the surface of SiC single crystal 10 (the white arrow on the right side in FIG. 7 is the direction of transportation).

The main container 20 may have a substrate holder 24 provided between the SiC single crystal 10 and the main container 20.

The heating furnace 30 according to the present embodiment has a configuration capable of heating by forming a temperature gradient such that the temperature decreases from the upper container 21 to the lower container 22 of the main container 20. Therefore, the substrate holder 24 capable of holding the SiC single crystal 10 may be provided between the SiC single crystal 10 and the lower container 22 to form an etching space X between the SiC single crystal 10 and the lower container 22.

It is sufficient that the substrate holder 24 has a configuration in which at least a part of the SiC single crystal 10 can be held in a hollow of the main container 20. For example, any conventional support means such as one-point support, three-point support, a configuration for supporting the outer peripheral edge, or a configuration for sandwiching a part thereof can be naturally adopted. As the material of the substrate holder 24, a SiC material or a high melting point metal material can be adopted.

The substrate holder 24 may not be provided depending on the direction of the temperature gradient of the heating furnace 30. For example, when the heating furnace 30 forms a temperature gradient so that the temperature decreases from the lower container 22 toward the upper container 21, the SiC single crystal 10 may be arranged on the bottom surface of the lower container 22 (without providing the substrate holder 24).

Next, the outline of the apparatus configuration for achieving the crystal growth step is illustrated on the right side in FIG. 7. As illustrated on the right side in FIG. 7, the main container 20 includes a source material supply space Y in which the SiC single crystal 10 is on the low temperature side of the temperature gradient, and the SiC material (a part of the main container 20) is on the high temperature side of the temperature gradient. That is, the source material supply space Y is formed by arranging the SiC single crystal 10 at a position where the temperature is lower than that of the SiC material (for example, the top surface of the upper container 21) due to the temperature gradient formed by the heating furnace 30.

That is, in the source material supply space Y, in addition to the SiC single crystal 10, a Si atom supply source and a C atom supply source as source materials exist. Then, by heating these, a Si atom and a C atom which are the source materials of the SiC single crystal 10 are supplied into the source material supply space Y. The Si atom and C atom are transported to the surface of the SiC single crystal 10 and recrystallized to form the growth layer 105 (the black arrow on the right side in FIG. 7 indicates the direction of transportation).

In the present embodiment, at least a part of the main container 20 is formed of polycrystalline SiC (Poly-SiC), so that the main container 20 itself is used as a Si atom supply source and a C atom supply source.

As the Si atom supply source and the C atom supply source, a material capable of supplying a Si atom such as a Si substrate, a material capable of supplying a C atom such as graphite, and a material capable of supplying a Si atom and a C atom such as a SiC substrate can be adopted.

The arrangement of the Si atom supply source and the C atom supply source is not limited to this form, and any form may be used as long as the Si atom and the C atom can be supplied in the source material supply space Y.

When polycrystalline SiC is used as a source material, a vapor pressure difference (chemical potential difference) between the polycrystalline SiC (source material) and the single crystal SiC (SiC single crystal 10) can be used as a growth driving force.

In the source material supply space Y, a temperature gradient is provided so that the temperature decreases toward the SiC single crystal 10. Using this temperature gradient as a growth driving force, the transportation of the Si atom and the C atom to the SiC single crystal 10 occurs, so that the growth rate of the growth layer 105 increases (the black arrow on the right side in FIG. 7 indicates the direction of transportation).

In order to efficiently reach the Si atom and the C atom to the SiC single crystal 10, the Si atom supply source and the C atom supply source may be brought close to the SiC single crystal 10. In the configuration on the right side of FIG. 7, the polycrystalline SiC upper container 21 serving as the Si atom supply source and the C atom supply source can be arranged in close proximity to and parallel to the SiC single crystal 10.

The distance between the surface of the SiC single crystal 10 and the top surface of the upper container 21 is preferably set to equal to or less than 100 mm, more preferably equal to or less than 10 mm, and further preferably equal to or less than 2.7 mm. It is preferably set to equal to or greater than 0.7 mm, more preferably equal to or greater than 1.2 mm, and further preferably equal to or greater than 1.7 mm.

It is desirable that the etching space X and the source material supply space Y are exhausted (evacuated) through a Si vapor pressure space Z. That is, it is desirable that the main container 20 having the etching space X and/or the source material supply space Y is arranged in the refractory container 40 having the Si vapor pressure space Z, and the SiC single crystal 10 is further arranged in the main container 20.

Next, the outline of the apparatus configuration for achieving the SiC—Si equilibrium vapor pressure environment is illustrated on the upper side in FIG. 7. As illustrated on the upper side in FIG. 7, the SiC—Si equilibrium vapor pressure environment can be formed by arranging the SiC single crystal 10 in a semi-closed space having an atomic number ratio Si/C of greater than 1 and heating the SiC single crystal 10.

When this is described using the mode on the upper left in FIG. 7, for example, the SiC single crystal 10 satisfying a stoichiometric ratio 1:1, the substrate holder 24 made of SiC satisfying a stoichiometric ratio 1:1, and the Si vapor supply source 25 (Si pellet or the like) are arranged in the main container 20 made of polycrystalline SiC satisfying a stoichiometric ratio 1:1, the atomic number ratio Si/C in the main container 20 is greater than 1. By heating the main container 20, the inside of the main container 20 approaches the SiC—Si equilibrium vapor pressure environment.

The outline of the apparatus configuration for achieving the SiC—C equilibrium vapor pressure environment is illustrated in the lower part of FIG. 7. As illustrated on the lower side in FIG. 7, the SiC—C equilibrium vapor pressure environment can be formed by arranging the SiC single crystal 10 in a semi-closed space having an atomic number ratio Si/C of equal to or less than 1 and heating the SiC single crystal 10.

For example, when this is described using the form on the lower left in FIG. 7, the SiC single crystal 10 satisfying a stoichiometric ratio 1:1 and the substrate holder 24 made of SiC satisfying a stoichiometric ratio 1:1 are arranged in the main container 20 made of polycrystalline SiC satisfying a stoichiometric ratio 1:1, the atomic number ratio Si/C in the main container 20 is 1 or equal to or less than 1. By heating the main container 20, the inside of the main container 20 approaches the SiC—C equilibrium vapor pressure environment.

In order to reduce the atomic number ratio Si/C in the main container 20, a C vapor supply source may be separately arranged, or a main container 20 or a substrate holder 24 including a C vapor supply source may be adopted. Examples of the C vapor supply source include solid C (C substrate or a C pellet of C powder or the like) and a C compound.

When a mode in which the heat treatment step S1 of performing etching in a SiC—C equilibrium vapor pressure environment is adopted, a SiC seed crystal 11 from which the strained layer 101 of the SiC single crystal 10 has been removed can be obtained.

When a mode in which the heat treatment step S1 of performing crystal growth in a SiC—C equilibrium vapor pressure environment is adopted, a high-quality SiC seed crystal 11 having the growth layer 105 from which BPD has been removed or reduced can be obtained.

This can suppress the occurrence of defects due to the strain (strained layer 101) of the SiC single crystal 10 and the inheritance of the BPD of the SiC single crystal 10, in the ingot growth step S2, which is a succeeding step.

On the other hand, when a mode in which the heat treatment step S1 for etching or performing crystal growth in a SiC—Si equilibrium vapor pressure environment is adopted, the surface of the SiC single crystal 10 can be planarized. That is, it is possible to obtain a SiC seed crystal 11 from which MSB has been removed or reduced. As a result, it is possible to prevent defects caused by MSB or the like from being inherited by the SiC ingot by the ingot growth step S2, which is a succeeding step.

Next, with reference to FIGS. 8 to 15, the strained layer removal step S11, the planarization step S12, and the basal plane dislocation reduction step S13 using the production apparatus according to the present embodiment will be described in detail.

<3-1> Strained Layer Removal Step S11

The strained layer removal step S11 is a step of removing the strained layer 101 introduced into the SiC single crystal 10 as illustrated in FIG. 8. Hereinafter, the strained layer removal step S11 will be described, but description of a portion that overlaps with the general description of the heat treatment step S1 described above is omitted.

Figure 9:
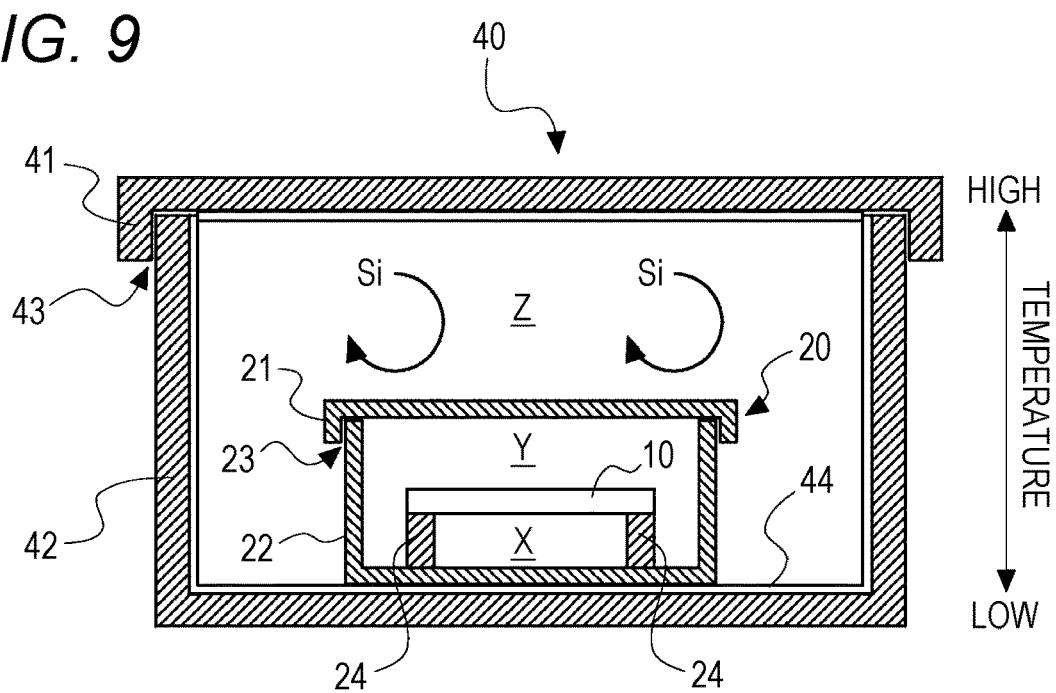
FIG. 9 is a diagram illustrating an apparatus configuration for achieving a strained layer removal step.

As illustrated in FIG. 9, the strained layer removal step S11 is a step of arranging the SiC single crystal 10 and the SiC material (upper container 21 made of polycrystalline SiC) in a semi-closed space having an atomic number ratio Si/C of equal to or less than 1 so that the SiC single crystal 10 and the SiC material face each other, and performing heating so that the SiC single crystal 10 is on the high temperature side and the SiC material is on the low temperature side (etching bunching step S111).

Alternatively, the strained layer removal step S11 is a step of arranging the SiC single crystal 10 and the SiC material (upper container 21 made of polycrystalline SiC) in a semi-closed space having an atomic number ratio Si/C of greater than 1 so that the SiC single crystal 10 and the SiC material face each other, and performing heating so that the SiC single crystal 10 is on the high temperature side and the SiC material is on the low temperature side (etching planarization step S121).

In other words, the strained layer removal step S11 is a step of arranging the SiC single crystal 10 and the SiC material so as to face each other, and performing heating so that the SiC single crystal 10 is on the high temperature side and the SiC material is on the low temperature side in a SiC—Si equilibrium vapor pressure environment or a SiC—C equilibrium vapor pressure environment.

As described above, by heat-treating the SiC single crystal 10 arranged on the high temperature side of the temperature gradient and a part of the main container 20 arranged on the low temperature side of the temperature gradient while the SiC single crystal 10 and the part of the main container 20 face each other, atoms are transported from the SiC single crystal 10 to the main container 20 to achieve etching of the SiC single crystal 10.

That is, the surface of the SiC single crystal 10 and the bottom surface of the main container 20 having a temperature lower than this surface are arranged so as to face each other, so that an etching space X is formed between them. In this etching space X, atom transportation occurs by using the temperature gradient formed by the heating furnace 30 as a driving force, and as a result, the SiC single crystal 10 can be etched.

On the other hand, on the opposite side (rear surface side) of the surface to be etched of the SiC single crystal 10, the rear surface of the SiC single crystal 10 and the top surface of the main container 20 having a temperature higher than this rear surface may be arranged so as to face each other so that a source material supply space Y is formed between the rear surface of the SiC single crystal 10 and the top surface of the main container 20. In this source material supply space Y, the source material is transported by using the temperature gradient formed by the heating furnace 30 as a driving force, and as a result, the growth layer 105 can be formed on the rear surface side of the SiC single crystal 10. In the strained layer removal step S11, a configuration may be adopted in which the rear surface side of the SiC single crystal 10 and the top surface of the main container 20 are brought into contact with each other so as not to form the source material supply space Y.

The main container 20 is arranged in a Si vapor pressure space Z in which the atmosphere containing the Si element is formed. As described above, the main container 20 is arranged in the Si vapor pressure space Z, and the inside of the main container 20 is exhausted (evacuated) through the space of the Si vapor pressure environment, so that it is possible to prevent Si atoms from decreasing in the inside of the main container 20. As a result, the preferable atomic number ratio Si/C in the main container can be maintained for a long time.

That is, when exhausting directly from the etching space X and the source material supply space Y without the Si vapor pressure space Z, Si atoms are exhausted from the gap 23. In this case, the atomic number ratio Si/C in the etching space X and the source material supply space Y is significantly reduced.

On the other hand, when the inside of the main container is exhausted through the Si vapor pressure space Z in the Si vapor pressure environment, it is possible to prevent the Si atoms from being exhausted from the etching space X and the source material supply space Y, so that the atomic number ratio Si/C in the main container 20 can be maintained.

The etching temperature in the strained layer removal step S11 is preferably set in the range of 1400 to 2300° C., and more preferably set in the range of 1600 to 2000° C.

The etching rate in the strained layer removal step S11 can be controlled in the above temperature range, and can be selected in the range of 0.001 to 2 μm/min.

The etching amount in the strained layer removal step S11 can be adopted as long as the strained layer 101 of the SiC single crystal 10 can be removed. Examples of the etching amount include an amount of equal to or greater than 0.1 μm and equal to or less than 20 μm, but the etching amount can be applied as needed.

The etching time in the strained layer removal step S11 can be set to an arbitrary time so as to have a desired etching amount. For example, when the etching rate is 1 μm/min and the etching amount is set to 1 μm, the etching time is 1 minute.

The temperature gradient in the strained layer removal step S11 is set in the range of 0.1 to 5° C./mm in the etching space X.

The case where etching is performed such that the SiC single crystal 10 and the SiC material face each other in the semi-closed space having the atomic number ratio Si/C of equal to or less than 1 (etching bunching step S111) has been described above with reference to FIG. 9.

Even in the case where etching is performed such that the SiC single crystal 10 and the SiC material face each other in a semi-closed space having an atomic number ratio Si/C of greater than 1 (etching planarization step S121), the strained layer 101 can be similarly removed.

As illustrated in FIG. 8, by performing the strained layer removal step S11 described above, the SiC seed crystal 11 in which the strained layer 101 is removed or reduced can be manufactured.

<3-2> Planarization Step S12

Figure 10:
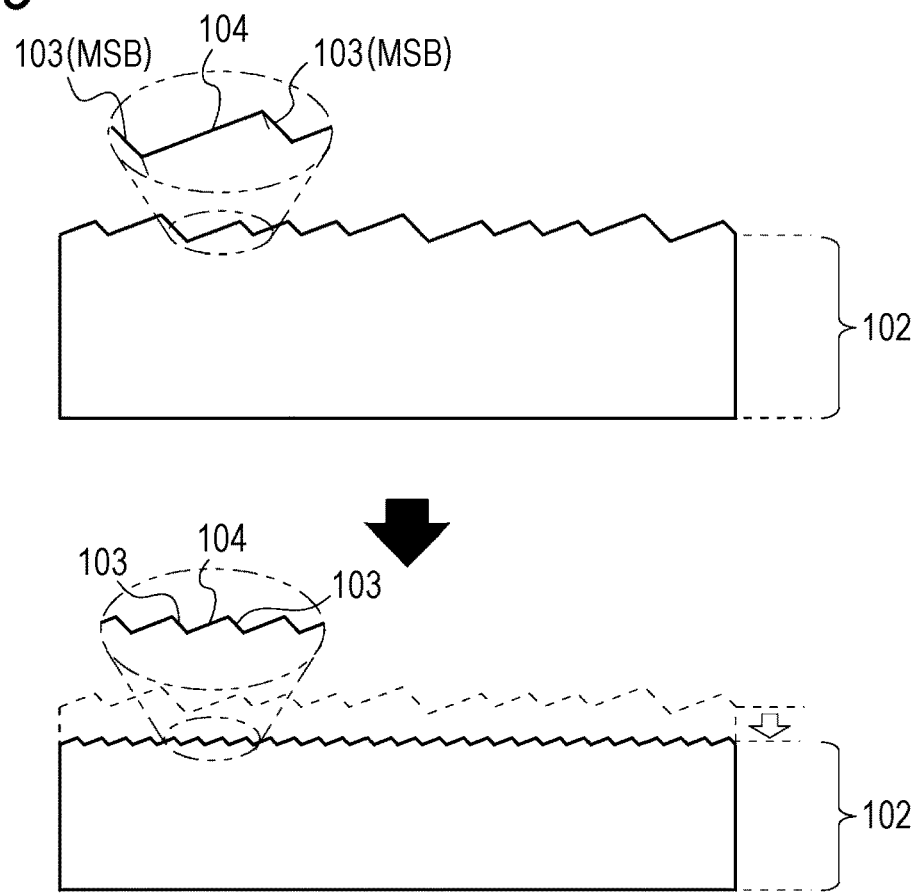
FIG. 10 is a diagram illustrating an outline of an etching planarization step.
Figure 12:
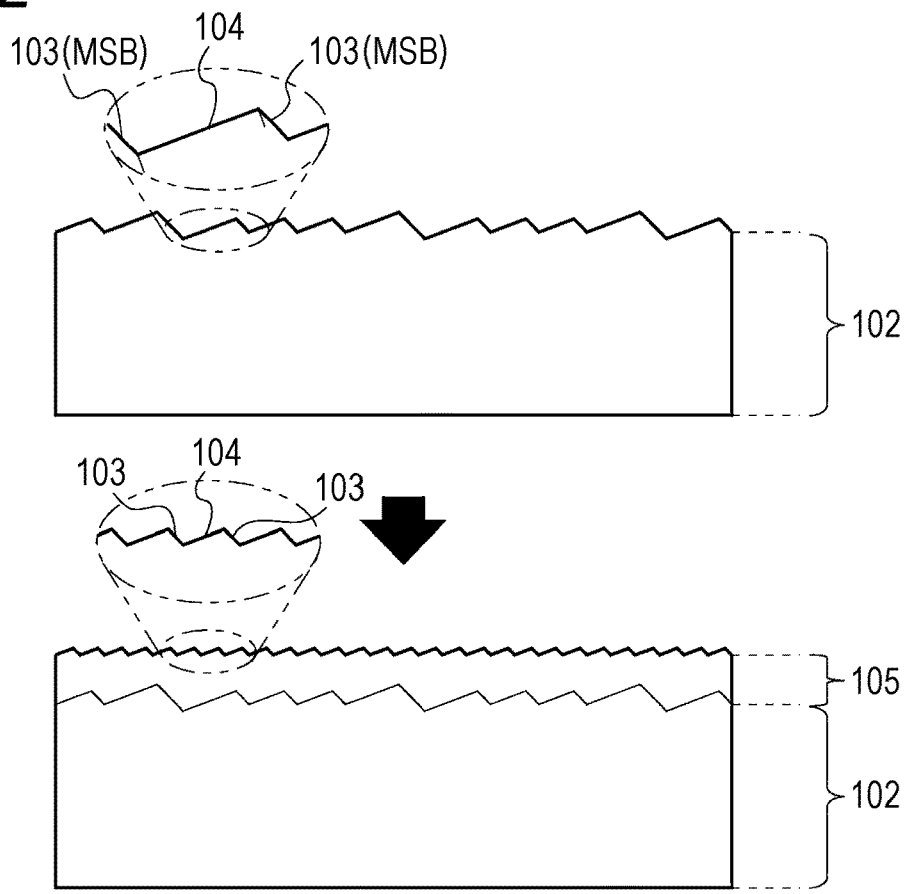
FIG. 12 is an explanatory diagram illustrating an outline of a growth planarization step.

The planarization step S12 is a step of decomposing and removing the MSB formed on the surface of the SiC seed crystal 11 as illustrated in FIGS. 10 and 12. As described above, preferable examples of the planarization step S12 include the etching planarization step S121 and the growth planarization step S122. Hereinafter, the planarization step S12 will be described, but description of a portion that overlaps with the general description of the heat treatment step S1 described above is omitted.

<3-2-1> Etching Planarization Step S121

As illustrated in FIG. 10, the etching planarization step S121 is a step of reducing or removing MSB by etching the surface of the SiC single crystal 10 on which MSB is formed.

Figure 11:
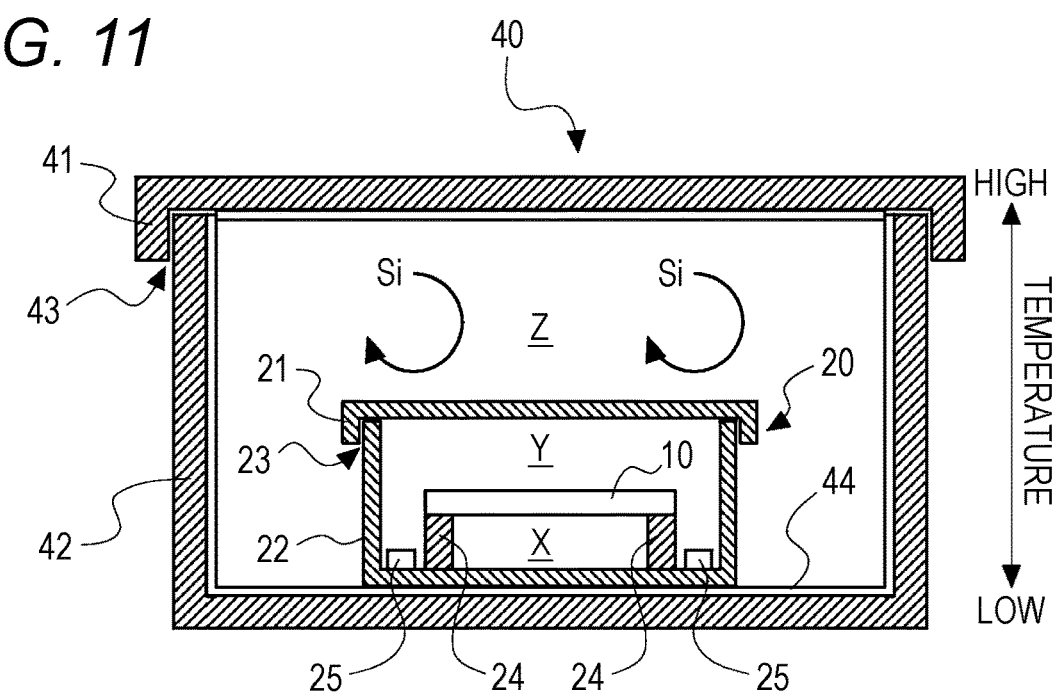
FIG. 11 is a diagram illustrating an apparatus configuration for achieving the etching planarization step.

As illustrated in FIG. 11, the etching planarization step S121 is a step of arranging the SiC single crystal 10 and the SiC material (lower container 22 made of polycrystalline SiC) in a semi-closed space having an atomic number ratio Si/C of greater than 1 so that the SiC single crystal 10 and the SiC material face each other, and performing heating so that the SiC single crystal 10 is on the high temperature side and the SiC material is on the low temperature side.

In other words, the strained layer removal step S11 is a step of arranging the SiC single crystal 10 and the SiC material so as to face each other, and performing heating so that the SiC single crystal 10 is on the high temperature side and the SiC material is on the low temperature side in a SiC—Si equilibrium vapor pressure environment.

The apparatus configuration for achieving the etching planarization step S121 is such that the Si vapor supply source 25 is further arranged in the main container 20 of the strained layer removal step S11. By arranging the Si vapor supply source 25, the SiC single crystal 10 can be heated in a SiC—Si equilibrium vapor pressure environment.

Description of the part that overlaps with the general description of the strained layer removal step S11 will be omitted as appropriate.

The etching temperature in the etching planarization step S121 is preferably set in the range of 1400 to 2300° C., and more preferably set in the range of 1600 to 2000° C.

The etching rate in the etching planarization step S121 can be controlled in the temperature range described above and can be selected in the range of 0.001 to 2 μm/min.

As the etching amount in the etching planarization step S121, any etching amount can be adopted as long as the MSB of the SiC single crystal 10 can be decomposed. Examples of the etching amount include an amount of equal to or greater than 0.1 μm and equal to or less than 20 μm.

The etching time in the etching planarization step S121 can be set to an arbitrary time so as to have a desired etching amount. For example, when the etching rate is 1 μm/min and the etching amount is set to 1 μm, the etching time is 1 minute.

The temperature gradient in the etching planarization step S121 is set in the range of 0.1 to 5° C./mm in the etching space X.

As illustrated in FIG. 10, according to the etching planarization step S121, by etching the surface of the SiC single crystal 10, it is possible to produce a SiC seed crystal 11 in which MSB is removed or reduced.

<3-2-2> Growth Planarization Step S122

As illustrated in FIG. 12, the growth planarization step S122 is a step of forming a growth layer 105 in which MSB is reduced or removed by performing crystal growth on the surface of the SiC single crystal 10 on which MSB is formed.

Figure 13:
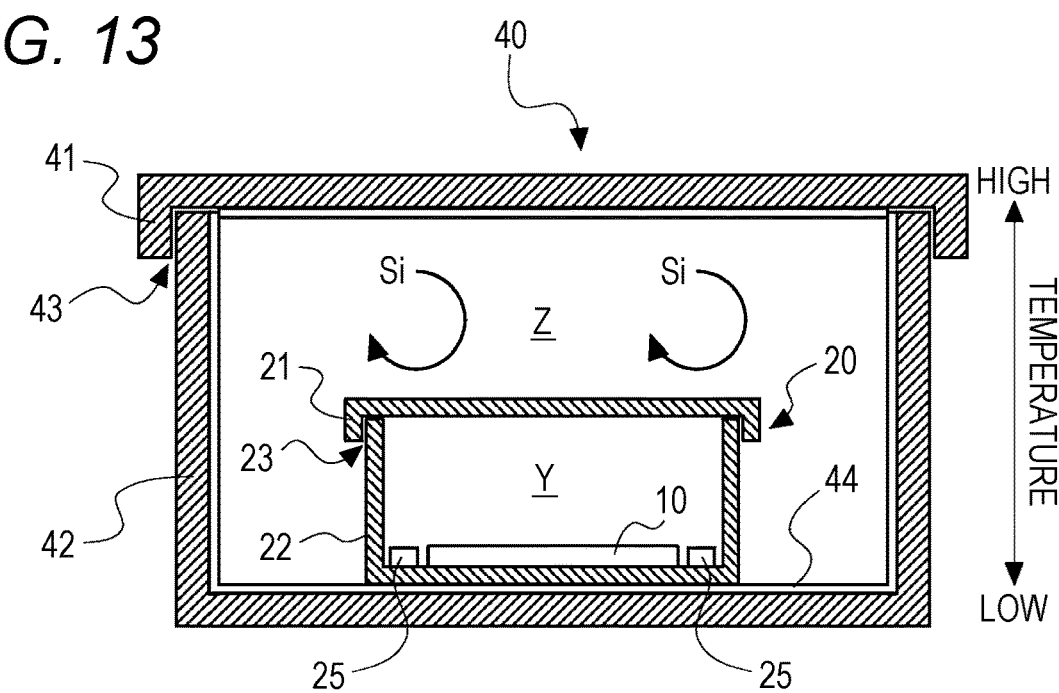
FIG. 13 is a diagram illustrating an apparatus configuration and an outline for achieving the growth planarization step.

As illustrated in FIG. 13, the growth planarization step S122 is a step of arranging the SiC single crystal 10 and the SiC material (upper container 21 made of polycrystalline SiC) in a semi-closed space having an atomic number ratio Si/C of greater than 1 so that the SiC single crystal 10 and the SiC material face each other, and performing heating so that the SiC single crystal 10 is on the low temperature side and the SiC material is on the high temperature side.

In other words, the strained layer removal step S11 is a step of arranging the SiC single crystal 10 and the SiC material so as to face each other, and performing heating so that the SiC single crystal 10 is on the low temperature side and the SiC material is on the high temperature side in a SiC—Si equilibrium vapor pressure environment.

As described above, by heat-treating the SiC single crystal 10 arranged on the low temperature side of the temperature gradient and a part of the main container 20 arranged on the high temperature side of the temperature gradient while the SiC single crystal 10 and the part of the main container 20 face each other, source materials are transported from the main container 20 to the SiC single crystal 10 to form the growth layer 105.

That is, the surface of the SiC single crystal 10 and the top surface of the main container 20 having a temperature higher than this surface are arranged so as to face each other, so that a source material supply space Y is formed between them. In this source material supply space Y, the source material is transported by using the temperature gradient formed by the heating furnace 30 and the chemical potential difference between the SiC single crystal 10 and the SiC material as a driving force, and as a result, the growth layer 105 can be formed on the front surface side of the SiC single crystal 10.

The apparatus configuration for achieving the growth planarization step S122 is such that the Si vapor supply source 25 is further arranged in the main container 20 as in the etching planarization step S121. Description of a portion that overlaps with the general description of the etching planarization step S121 will be omitted.

The heating temperature in the growth planarization step S122 is preferably set in the range of 1400 to 2200° C., and more preferably set in the range of 1600 to 2000° C.

The growth rate in the growth planarization step S122 can be controlled in the temperature range described above and can be selected in the range of 0.001 to 1 μm/min.

The amount of growth in the growth planarization step S122 is preferably equal to or greater than 5 μm, more preferably equal to or greater than 8 μm.

The growth time in the growth planarization step S122 can be set to an arbitrary time so as to have a desired growth amount. For example, when the growth rate is 10 nm/min and the growth amount is set to 10 μm, the growth time is 100 minutes.

The degree of vacuum (main heating chamber 31) in the growth planarization step S122 is $10^{-5}$ to 10 Pa, more preferably $10^{-3}$ to 1 Pa.

In the growth planarization step S122, it is also possible to introduce an inert gas during growth. Ar or the like can be selected for this inert gas, and the degree of vacuum of the heating furnace 30 (main heating chamber 31) can be adjusted by introducing this inert gas in the range of $10^{-5}$ to 10000 Pa.

As illustrated in FIG. 12, according to the growth planarization step S122, by growing the growth layer 105 having no MSB on the surface of the SiC single crystal 10, it is possible to produce a SiC seed crystal 11 in which MSB is removed or reduced.

<3-3> Basal Plane Dislocation Reduction Step S13

Figure 14:
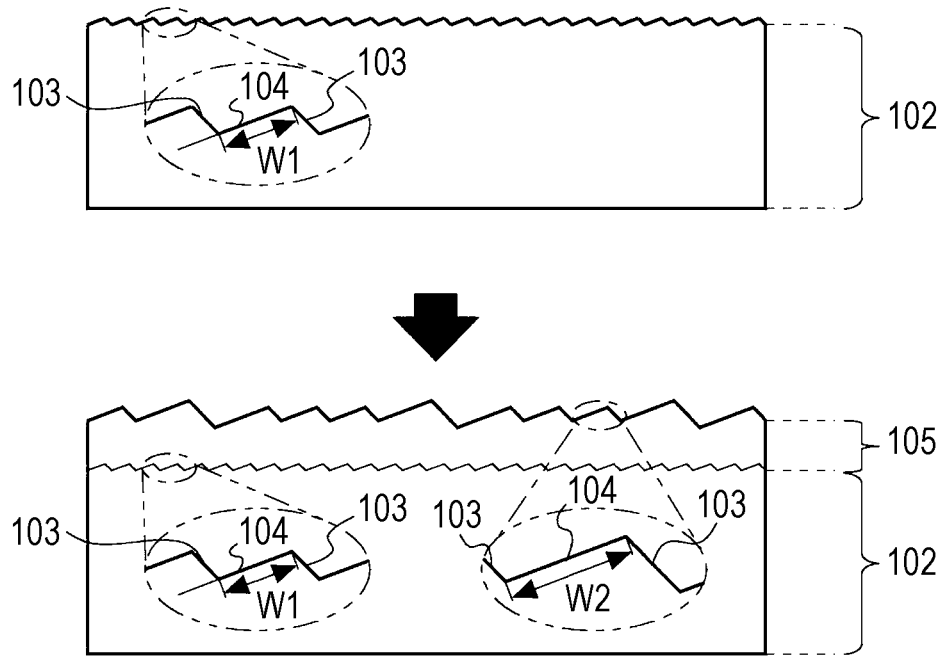
FIG. 14 is an explanatory diagram illustrating an outline of a basal plane dislocation reduction step.

As illustrated in FIG. 14, the basal plane dislocation reduction step S13 is a step of forming a growth layer 105 in which BPD is removed or reduced by performing crystal growth under the condition that a terrace width W of the SiC single crystal 10 is increased. Description of the part that overlaps with the general description of the heat treatment step S1 will be omitted.

Figure 15:
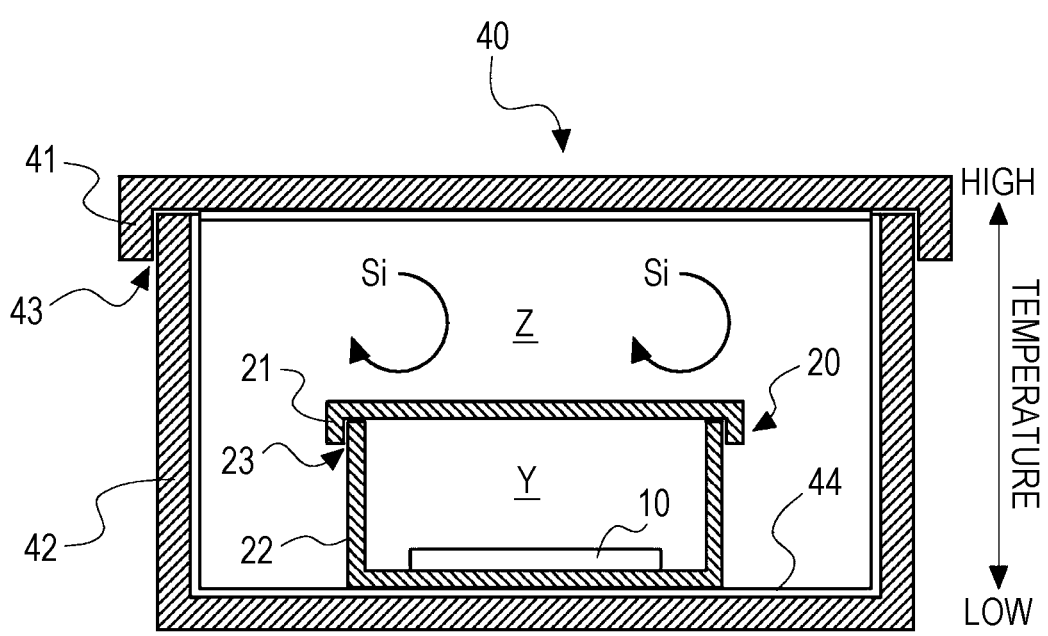
FIG. 15 is a diagram illustrating an apparatus configuration and an outline for achieving a basal plane dislocation reduction step.

As illustrated in FIG. 15, the basal plane dislocation reduction step S13 is a step of arranging the SiC single crystal 10 and the SiC material (upper container 21 made of polycrystalline SiC) in a semi-closed space having an atomic number ratio Si/C of equal to or less than 1 so that the SiC single crystal 10 and the SiC material face each other, and performing heating so that the SiC single crystal 10 is on the low temperature side and the SiC material is on the high temperature side.

In other words, the strained layer removal step S11 is a step of arranging the SiC single crystal 10 and the SiC material so as to face each other, and performing heating so that the SiC single crystal 10 is on the low temperature side and the SiC material is on the high temperature side in a SiC—C equilibrium vapor pressure environment.

As similar to the growth planarization step S122, in the apparatus configuration for achieving the basal plane dislocation reduction step S13, by heat-treating the SiC single crystal 10 arranged on the low temperature side of the temperature gradient and a part of the main container (SiC material) arranged on the high temperature side of the temperature gradient while the SiC single crystal 10 and the part of the main container 20 face each other, source materials are transported from the main container 20 to the SiC single crystal 10 to form the growth layer 105.

On the other hand, in this basal plane dislocation reduction step S13, unlike the growth planarization step S122, the Si vapor supply source 25 is not arranged. Description of a portion that overlaps with the general description of the growth planarization step S122 will be omitted.

The heating temperature in the basal plane dislocation reduction step S13 is preferably set in the range of 1400 to 2200° C., and more preferably set in the range of 1600 to 2000° C.

The growth rate in the basal plane dislocation reduction step S13 can be controlled in the temperature range described above and the growth environment and can be selected in the range of 0.001 to 1 μm/min.

The amount of growth in the basal plane dislocation reduction step S13 is preferably equal to or greater than 5 μm, more preferably equal to or greater than 8 μm.

The growth time in the basal plane dislocation reduction step S13 can be set to an arbitrary time so as to have a desired growth amount. For example, when the growth rate is 10 nm/min and the growth amount is set to 10 μm, the growth time is 100 minutes.

The degree of vacuum (main heating chamber 31) in the basal plane dislocation reduction step S13 is $10^{-5}$ to 10 Pa, more preferably $10^{-3}$ to 1 Pa.

In the basal plane dislocation reduction step S13, it is also possible to introduce an inert gas during growth. Ar or the like can be selected for this inert gas, and the degree of vacuum of the heating furnace 30 (main heating chamber 31) can be adjusted by introducing this inert gas in the range of $10^{-3}$ to 10000 Pa.

According to the basal plane dislocation reduction step S13, the conversion rate (BPD conversion rate) at which BPD is converted into other defects/dislocations is improved by performing growth under the condition that the width of the terrace 104 (terrace width W) is increased, so that the BPD density in the growth layer 105 can be reduced or removed. The condition that the terrace width W is increased is a condition that the terrace width W2 after growth is increased as compared with the terrace width W1 before growth, and can be achieved, for example, by performing growth in a SiC—C equilibrium vapor pressure environment or a C-rich environment.

As the value of the terrace width W (including the terrace width W1 and the terrace width W2), for example, the average value of the terrace width obtained by drawing a line perpendicular to the step 103 of the captured SEM image and counting the number of steps 103 existing on this line may be adopted (terrace width W=line length/number of steps on the line).

Preferably, the basal plane dislocation reduction step S13 is performed after the planarization step S12. That is, comparing the width of the terrace 104 on the surface where the MSB is not formed and the width of the terrace 104 on the surface where the MSB is formed, the terrace 104 on the surface where the MSB is not formed is narrower than the terrace 104. Therefore, the BPD conversion rate can be improved by growing the growth layer 105 under the condition that the MSB is formed after the decomposition of the MSB.

<3-4> Preferred Mode of Heat Treatment Step S1

Figure 16:
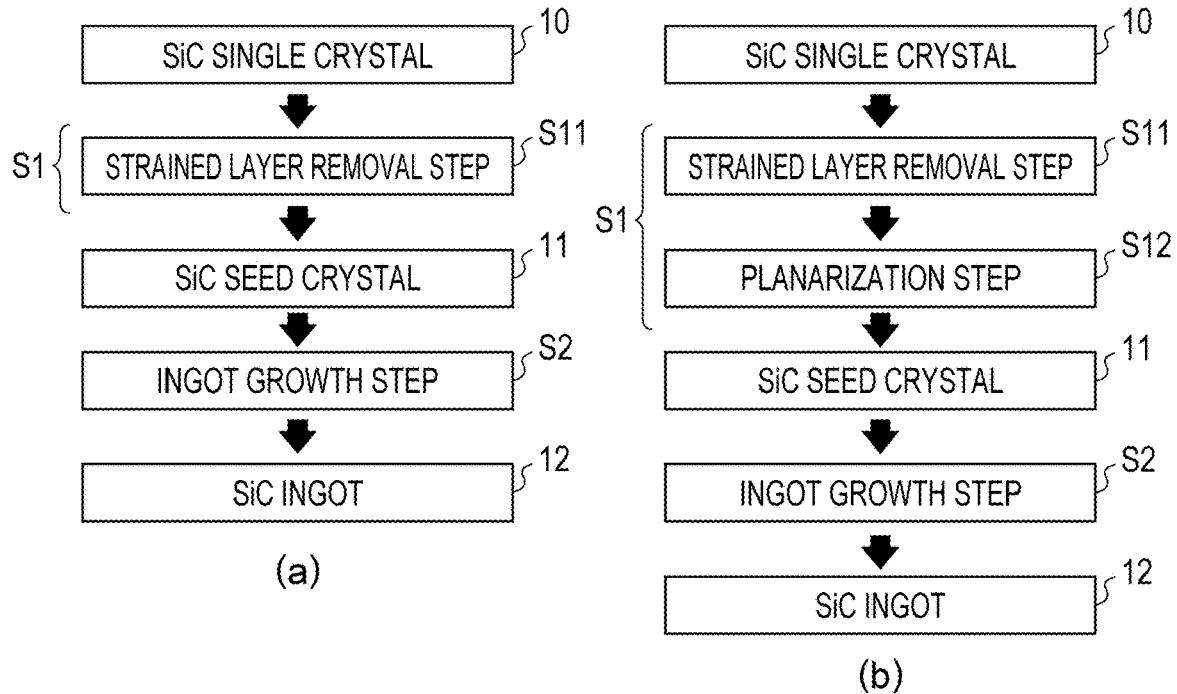
FIG. 16 illustrates a preferred mode of a step of producing a SiC ingot.
Figure 16:
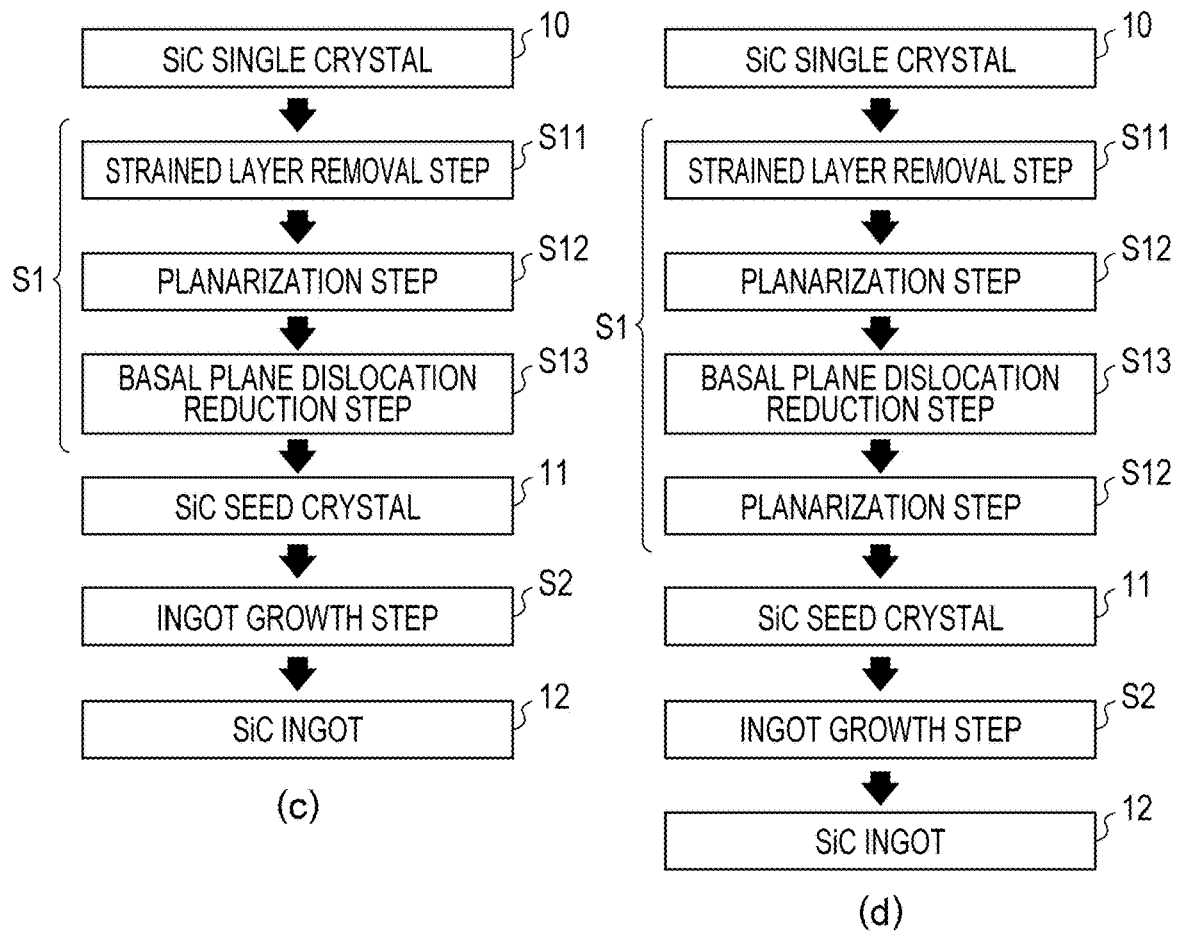

FIG. 16 illustrates a preferred embodiment of a step of treating the SiC single crystal 10 by the heat treatment step S1 to produce the SiC seed crystal 11 and then performing the ingot growth step S2 to produce the SiC ingot 12.

FIG. 16(a) illustrates a mode in which the strained layer removal step S11 is performed as the heat treatment step S1 and the SiC seed crystal 11 thus obtained is subjected to the ingot growth step S2.

According to the mode illustrated in FIG. 16(a), the SiC seed crystal 11 from which the strained layer 101 is removed can be obtained. That is, it is possible to prevent the defects caused by the strained layer 101 from being inherited by the SiC ingot 12.

As the strained layer removal step S11 in the mode illustrated in FIG. 16, either the etching bunching step S111 or the etching planarization step S121 can be adopted.

When the etching planarization step S121 is adopted, the strained layer 101 can be removed and the MSB can be removed or reduced at the same time.

FIG. 16(b) illustrates a mode in which the planarization step S12 is performed after the strained layer removal step S11. According to such a mode, a SiC seed crystal 11 having no strained layer 101 and MSB on its surface can be produced. This makes it possible to produce a high-quality SiC ingot 12.

FIG. 16(c) illustrates a mode in which the basal plane dislocation reduction step S13 is performed after the strained layer removal step S11 and the planarization step S12. By performing the strained layer removal step S11 and the planarization step S12 in advance as in this mode, the conversion rate at which BPD is converted into other defects/dislocations in the succeeding basal plane dislocation reduction step S13 (BPD conversion rate) can be improved, and a growth layer 105 in which the BPD density is further reduced can be formed.

FIG. 16(d) illustrates a mode in which the planarization step S12 is further performed after the basal plane dislocation reduction step S13 in the mode illustrated in FIG. 16(c). By performing the planarization step S12 after the basal plane dislocation reduction step S13 as described above, it is possible to produce a SiC seed crystal 11 that does not contain MSB on the surface as well as the strained layer 101 and BPD.

As the planarization step S12 illustrated in the form illustrated in FIG. 16, any of the etching planarization step S121 and the growth planarization step S122 can be adopted.

When two or more steps selected from the strained layer removal step S11 (etching bunching step S111 or etching planarization step S121), the planarization step S12 (etching planarization step S121 or growth planarization step S122), and the basal plane dislocation reduction step S13 are included as the heat treatment step S1, the two or more steps can be heat-treated with the same apparatus configuration.

Examples of the container in which the plurality of heat treatment steps S1 are performed include a container that generates an atmosphere of Si element and C element in the internal space, specifically, a main container 20.

As described above, by using the main container 20 and the like, even if the heat treatment step S1 includes a plurality of steps, all of them can be completed in the same container, so that the work can be expected to be simplified. Since etching and crystal growth can be performed with the same apparatus system, it is not necessary to introduce a plurality of apparatuses, which is very advantageous in industry.

<4> SiC Seed Crystal 11

The present invention also relates to a SiC seed crystal 11 produced through the heat treatment step S1. The SiC seed crystal 11 of the present invention does not include factors such as strained layer 101, BPD, and MSB that adversely affect the ingot growth by the heat treatment step S1 on the surface. Therefore, according to the SiC seed crystal 11 of the present invention, it is possible to grow a higher-quality SiC ingot.

The SiC seed crystal 11 is preferably characterized by having a growth layer 105 having no BPD on its surface. The thickness of the growth layer 105 containing no BPD is preferably equal to or greater than 0.001 μm, more preferably equal to or greater than 0.01 μm, and further preferably equal to or greater than 0.1 μm. When the thickness of the layer containing no BPD is within the above range, it is possible to suppress the propagation of BPD present in the SiC seed crystal 11 to the ingot in the growth step of growing SiC on the SiC seed crystal 11.

The diameter of the SiC seed crystal 11 of the present invention is not particularly limited, and is preferably equal to or greater than 6 inches, more preferably equal to or greater than 8 inches, and further preferably equal to or greater than 12 inches. By growing the SiC seed crystal 11 having such a size to produce the SiC ingot 12, it is possible to obtain a high-quality SiC wafer 13 having a large diameter.

<5> Ingot Growth Step S2

The ingot growth step S2 is a step of growing a single crystal SiC on the SiC seed crystal 11 to produce a SiC ingot 12. Examples of the ingot growth step S2 include any known growth method may be adopted, and a sublimation method or a CVD method.

<6> SiC Ingot 12

The present invention also relates to a SiC ingot 12 produced by the above-mentioned ingot growth step S2.

The SiC ingot 12 of the present invention includes almost no BPD and is of high quality.

<7> Slicing Step S3

The slicing step S3 is a step of cutting out the SiC wafer 13 from the SiC ingot 12.

Examples of slicing means of the slicing step S3 include a multi-wire saw cutting of cutting the SiC ingot 12 at predetermined intervals by reciprocating a plurality of wires, an electric discharge machining method of cutting by intermittently generating a plasma discharge, and cutting using a laser that emits and condenses a laser beam in the SiC ingot 12 to form a layer serving as a base point for cutting.

<8> SiC Wafer 13

The present invention also relates to a SiC wafer 13 obtained through the above steps. The SiC wafer 13 of the present invention is produced from a SiC ingot 12 derived from a SiC seed crystal 11 in which strain and dislocation are suppressed. Therefore, according to the SiC wafer 13 of the present invention, defects propagating to the epitaxial layer formed in the epitaxial growth step S5, which is a succeeding step, can be significantly reduced. NM In the SiC wafer 13, the surface on which the semiconductor element is formed (specifically, the surface on which the epitaxial layer is deposited) is referred to as a main surface. The surface facing the main surface is referred to as a rear surface. The main surface and the rear surface are collectively referred to as a surface.

Examples of the main surface of the SiC wafer 13 include a surface having an off angle of several degrees (for example, 0.4 to 8°) from a (0001) surface or a (000-1) surface (in the present specification, in the notation of the Miller index, "-" means the bar attached to the index immediately after the "-").

<9> Surface Treatment Step S4

The surface treatment step S4 is a step of treating the surface of the SiC wafer 13 in a state (epi-ready) that can be subjected to the epitaxial growth step S5, which is a succeeding step.

For the surface treatment step S4, a known method of treating a SiC wafer can be applied without limitation. Typically, examples of the step include a mode of performing a rough grinding step of a loose abrasive grain method (lapping polishing or the like) or the like of performing treating while pouring fine abrasive grains on a surface plate, then performing a finish grinding step using abrasive grains having a grain size smaller than that of the abrasive grains used in the rough grinding step, and finally, performing a chemical mechanical polishing (CMP) step of performing polishing using a combination of a mechanical action of a polishing pad and a chemical action of a slurry.

<10> Epitaxial Growth Step S5

The epitaxial growth step S5 is a step of forming an epitaxial film on the main surface of the SiC wafer 13 by epitaxial growth to form a SiC wafer with epitaxial film 14 used for applications such as power devices.

As means for epitaxial growth in the epitaxial growth step S5, a known method can be used without limitation. Examples of such means include a chemical vapor deposition (CVD), a physical vapor transport (PVT), and a metastable solvent epitaxy (MSE).

<11> SiC Wafer with Epitaxial Film 14

The present invention also relates to a SiC wafer with epitaxial film 14 produced by the above steps.

As described above, the SiC wafer with epitaxial film 14 of the present invention is derived from the SiC wafer 13 in which strain, BPD, and MSB are suppressed, so that the propagation of defects to the epitaxial layer is suppressed. Therefore, according to the SiC wafer with epitaxial film 14 of the present invention, it is possible to provide a high-performance SiC semiconductor device.

EXAMPLE

The present invention will be described in more detail below with reference to Example 1, Example 2, Example 3, and Example 4.

Example 1 is an example for specifically explaining the etching bunching step S111. Example 2 is an example for specifically explaining the etching planarization step S121. Example 3 is an example for specifically explaining the growth planarization step S122. Example 4 is an example for specifically explaining the basal plane dislocation reduction step S13.

Example 1: Etching Bunching Step

The SiC single crystal 10 was accommodated in the main container 20 and the refractory container 40 (see FIG. 9), and the heat treatment was performed under the following heat treatment conditions to remove the strained layer 101 of the SiC single crystal 10.

[SiC Single Crystal 10]
  Polymorphism: 4H—SiC
  Substrate size: Width 10 mm× Length 10 mm× Thickness 0.45 mm
  Off direction and off angle: <11-20> direction and 4° off
  Etched surface: (0001) surface
  Depth of strained layer 101: 5 μm
  The depth of the strained layer 101 was checked by the SEM-EBSD method. The strained layer 101 can also be checked by TEM, pXRD, and Raman spectroscopy.
[Main Container 20]
  Material: Polycrystalline SiC
  Container size: Diameter 60 mm× Height 4 mm
  Substrate holder 24 material: Single crystal SiC
  Distance between SiC single crystal 10 and bottom surface of main container 20: 2 mm
  Atomic number ratio in container Si/C: equal to or less than 1
[Refractory Container 40]
  Material: TaC
  Container size: Diameter 160 mm× Height 60 mm
  Si vapor supply source 44 (Si compound): $TaSi_2$
[Heat Treatment Conditions]
  The SiC single crystal 10 arranged under the above condition was heat-treated under the following conditions.
  Heating temperature: 1800° C.
  Heating time: 20 min Etching amount: 5 μm
Temperature gradient: 1° C./mm
Etching rate: 0.25 μm/min
Main heating chamber vacuum degree: $10^{-3}$ Pa
[Measurement of Strained Layer by SEM-EBSD Method]

The lattice strain of the SiC single crystal 10 can be obtained by comparing the lattice with a reference crystal lattice as a reference. As a means of measuring this lattice strain, for example, the SEM-EBSD method can be used. The SEM-EBSD method is a method (Electron Back Scattering Diffraction (EBSD)) that enables strain measurement of minute regions on the basis of the Kikuchi line diffraction pattern obtained by electron backscattering in a scanning electron microscope (SEM). In this method, the amount of lattice strain can be obtained by comparing the diffraction pattern of the reference crystal lattice as a reference with the diffraction pattern of the measured crystal lattice.

As the reference crystal lattice, for example, a reference point is set in a region where lattice strain is not considered to occur. That is, it is desirable to arrange the reference point in the region of the bulk layer 102 in FIG. 8. In general, it is a well-established theory that the depth of the strained layer 101 is about 10 μm. Therefore, it is sufficient that the reference point is set at a position of the depth of about 20 to 35 μm, which is considered to be sufficiently deeper than the strained layer 101.

Next, the diffraction pattern of the crystal lattice at this reference point is compared with the diffraction pattern of the crystal lattice of each measurement region measured at a pitch on the order of nanometers. This makes it possible to calculate the amount of lattice strain in each measurement region with respect to the reference point.

The case where a reference point that is considered to have no lattice strain is set as the reference crystal lattice has been described. However, it is also possible to use an ideal crystal lattice of single crystal SiC as the reference, or use a crystal lattice that occupies the majority (for example, equal to or greater than a half) of the measurement region surface as the reference.

By measuring whether lattice strain exists by this SEM-EBSD method, the presence or absence of the strained layer 101 can be determined. That is, when subsurface damage such as a scratch 1011, a latent scratch 1012, and strain 1013 is introduced, lattice strain occurs in the SiC single crystal 10, and stress is observed by the SEM-EBSD method.

The strained layer 101 existing in the SiC single crystal 10 before the heat treatment step S1 and the strained layer 101 existing in the SiC single crystal 10 after the heat treatment step S1 were observed by the SEM-EBSD method. The results are shown in FIGS. 17(*a*) and 17(*b*).

In this measurement, the cross section of the SiC single crystal 10 before and after the heat treatment step S1 was measured using a scanning electron microscope under the following conditions.
  SEM device: Zeiss Merline
  EBSD analysis: OIM crystal orientation analyzer manufactured by TSL Solutions
  Acceleration voltage: 15 kV
  Probe current: 15 nA
Step size: 200 nm
  Reference point R depth: 20 μm
FIG. 17(*a*) is a cross-sectional SEM-EBSD captured image of the SiC single crystal 10 before the heat treatment step S1.

Figure 17:
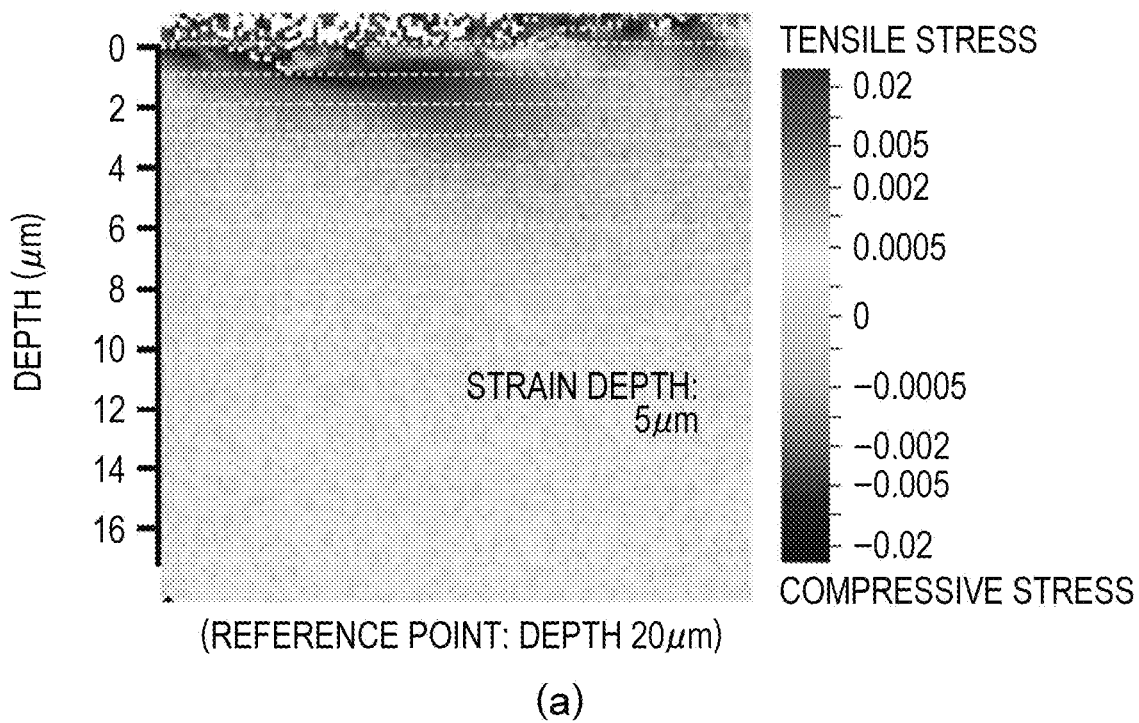
FIG. 17 is an explanatory diagram of a SiC seed crystal obtained in the strained layer removal step of the present invention.
Figure 17:
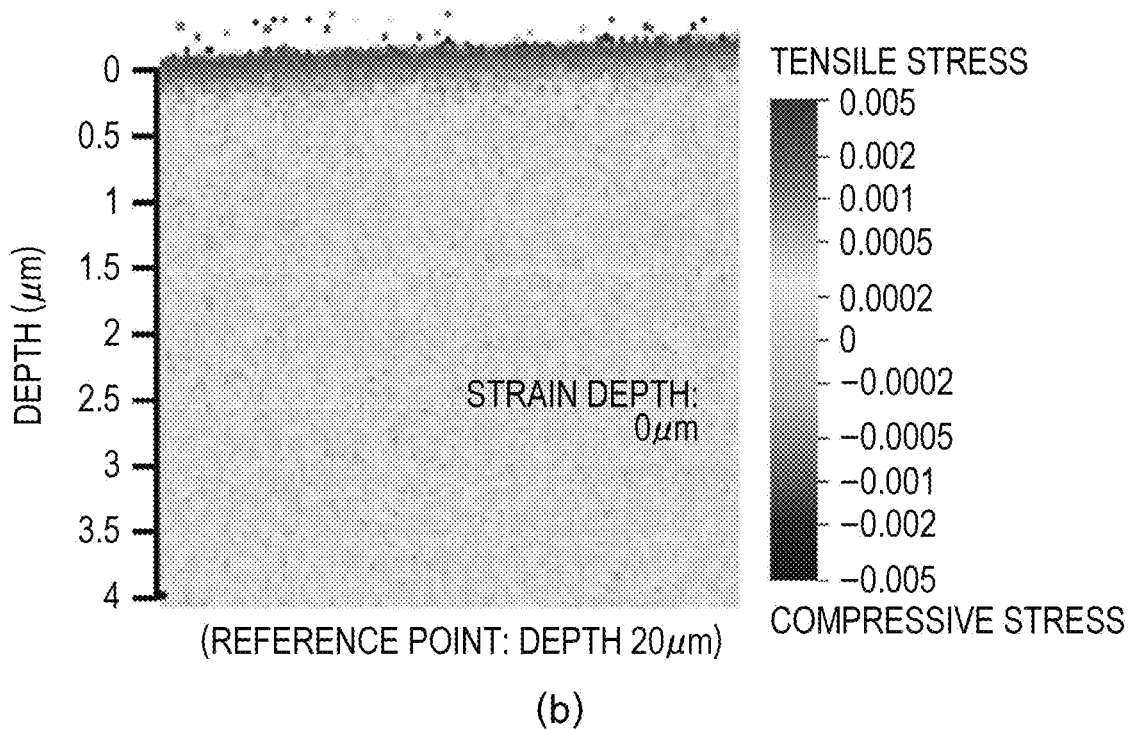

As illustrated in FIG. 17(*a*), lattice strain having a depth of 5 μm was observed in the SiC single crystal 10 before the heat treatment step S1. This is lattice strain introduced during machining, and it can be seen that there is a strained layer 101. In FIG. 17(*a*), compressive stress is observed.

FIG. 17(*b*) is a cross-sectional SEM-EBSD captured image of the SiC single crystal 10 after the heat treatment step S1.

As illustrated in FIG. 17(*b*), no lattice strain was observed in the SiC single crystal 10 after the heat treatment step S1. That is, it can be seen that the strained layer 101 was removed by the heat treatment step S1.

MSB was formed on the surface of the SiC single crystal 10 after the heat treatment step S1.

As described above, according to the etching bunching step S111, the strained layer 101 can be removed or reduced by etching the SiC single crystal 10 in a semi-closed space having an atomic number ratio Si/C of equal to or less than 1. As a result, the SiC seed crystal 11 in which the strained layer 101 is removed or reduced can be produced.

Example 2: Etching Planarization Step

Figure 18:
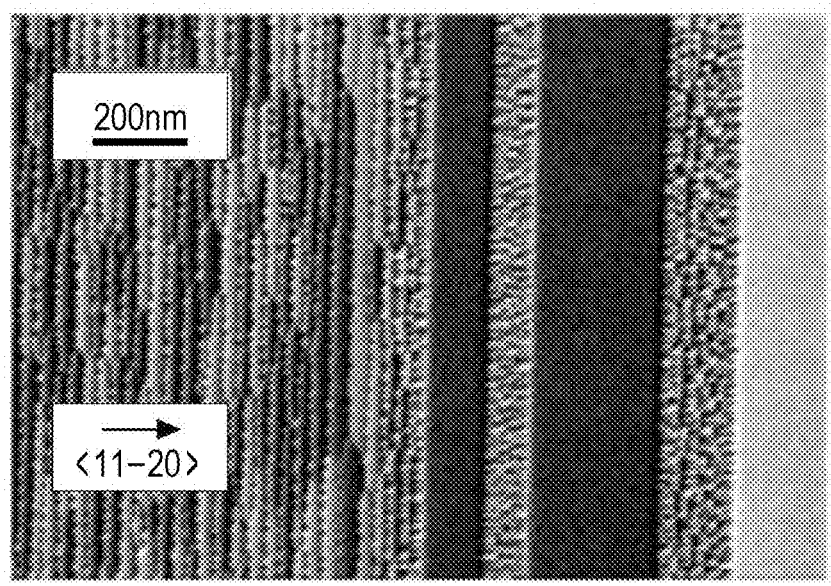
FIG. 18 is an explanatory diagram of a SiC seed crystal obtained in the etching planarization step of the present invention.
Figure 18:
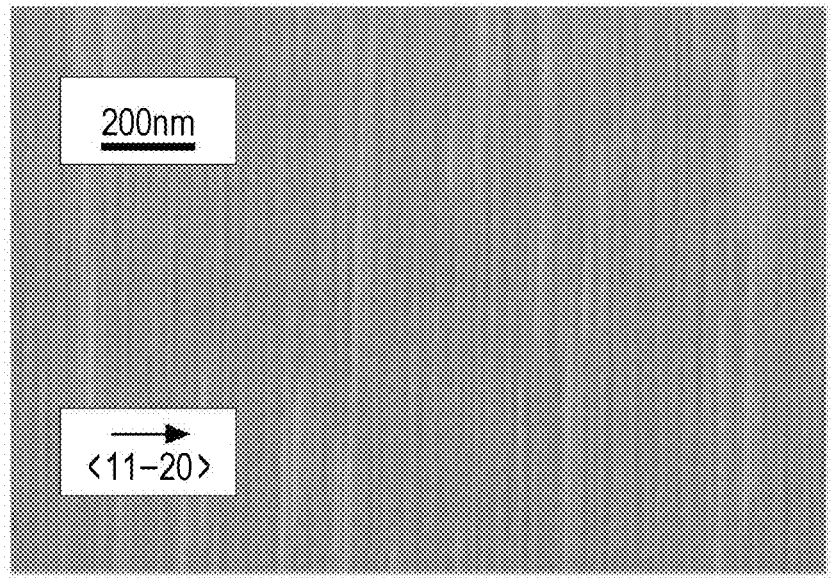

The SiC single crystal 10 was accommodated in the main container 20 and the refractory container 40 (see FIG. 11), and the heat treatment was performed under the following heat treatment conditions to remove MSB on the surface of the SiC single crystal 10.
[SiC Single Crystal 10]
  Polymorphism: 4H—SiC
  Substrate size: Width 10 mm× Length 10 mm× Thickness 0.3 mm
  Off direction and off angle: <11-20> direction and 4° off
  Etched surface: (0001) surface
Existence of MSB: Exist
  The step height, terrace width, and existence of MSB can be checked by an atomic force microscope (AFM) or a scanning electron microscope (SEM) image contrast evaluation method disclosed in JP 2015-179082 A.
[Main Container 20]
  Material: Polycrystalline SiC
  Container size: Diameter 60 mm× Height 4 mm
  Substrate holder 24 material: Single crystal SiC
  Distance between SiC single crystal 10 and bottom surface of main container 20: 2 mm
  Si vapor supply source 25: Single crystal Si piece
  Atomic number ratio in container Si/C: greater than 1
  As described above, by accommodating the Si piece together with the SiC single crystal 10 in the main container 20, the atomic number ratio Si/C in the container is greater than 1.
[Refractory Container 40]
  Material: TaC
  Container size: Diameter 160 mm× Height 60 mm
  Si vapor supply source 44 (Si compound): $TaSi_2$
[Heat Treatment Conditions]
  The SiC single crystal 10 arranged under the above condition was heat-treated under the following conditions.
  Heating temperature: 1900° C.
  Heating time: 60 min
  Temperature gradient: 1° C./mm
  Etching rate: 300 nm/min
  Main heating chamber vacuum degree: $10^{-3}$ Pa
  The step 103 of the SiC single crystal 10 before the heat treatment step S1 and step 103 of the SiC single crystal 10 after the heat treatment step S1 were observed by the SEM. The results are shown in FIGS. 18(*a*) and 18(*b*). The height of the step 103 was measured by an atomic force microscope (AFM). The terrace 104 width was measured by the SEM.

FIG. 18(*a*) is an SEM image of the surface of the SiC single crystal 10 before the heat treatment step S1. MSB having a height of equal to or greater than 3 nm is formed on the surface of the SiC single crystal 10 before the heat treatment step S1.

FIG. 18(*b*) is an SEM image of the surface of the SiC single crystal 10 after the heat treatment step S1. It can be seen that no MSB is formed on the surface of the SiC single crystal 10 after the heat treatment step S1, and the steps of 1.0 nm (full unit cell) are regularly arranged.

As described above, according to the etching planarization step S121, MSB can be removed or reduced by etching the SiC single crystal 10 in a semi-closed space having an atomic number ratio Si/C of greater than 1. This makes it possible to produce a SiC seed crystal 11 in which MSB is removed or reduced.

When the SiC single crystal 10 after the heat treatment step S1 was observed by the SEM-EBSD method, the strained layer 101 was not observed as in Example 1. That is, the strained layer 101 can also be removed in the etching planarization step S121.

Example 3: Growth Planarization Step

Figure 19:
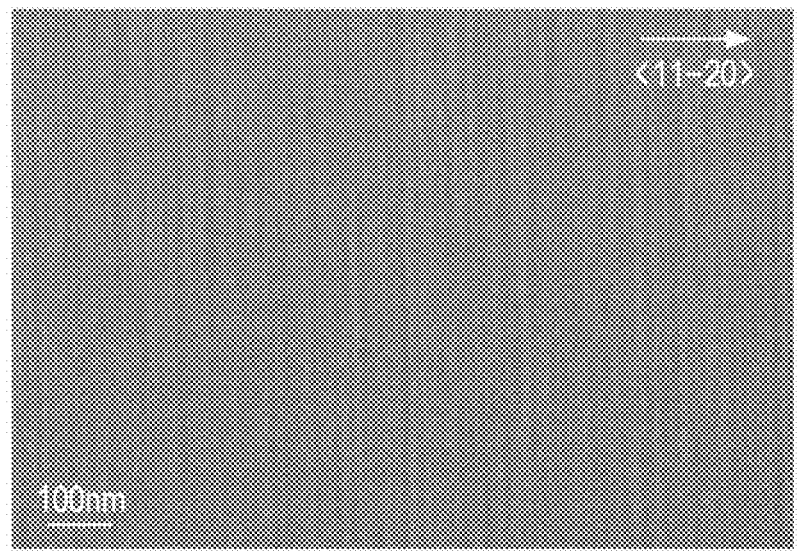
FIG. 19 is an explanatory diagram of a SiC seed crystal obtained in the growth planarization step of the present invention.

The SiC single crystal 10 was accommodated in the main container 20 and the refractory container 40 (see FIG. 13), and the heat treatment was performed under the following heat treatment conditions to remove MSB on the surface of the SiC single crystal 10.
[SiC Single Crystal 10]
　Polymorphism: 4H—SiC
　Substrate size: Width 10 mm× Length 10 mm× Thickness 0.3 mm
　Off direction and off angle: <11-20> direction and 4° off
　Etched surface: (0001) surface
Existence of MSB: Exist
　[Main Container 20]
　Material: Polycrystalline SiC
　Container size: Diameter 60 mm× Height 4 mm
　Distance between SiC single crystal 10 and bottom surface of main container 20: 2 mm
　Si vapor supply source 25: Single crystal Si piece
　Atomic number ratio in container Si/C: greater than
　As described above, by accommodating the Si piece together with the SiC single crystal 10 in the main container 20, the atomic number ratio Si/C in the container is greater than 1.
[Refractory Container 40]
　Material: TaC
　Container size: Diameter 160 mm× Height 60 mm
　Si vapor supply source 44 (Si compound): TaSi$_2$
[Heat Treatment Conditions]
　The SiC single crystal 10 arranged under the above condition was heat-treated under the following conditions.
　Heating temperature: 1800° C.
　Heating time: 60 min
　Temperature gradient: 1° C./mm
　Growth rate: 68 nm/min
　Main heating chamber 31 vacuum degree: 10$^{-5}$ Pa The step 103 on the surface of the SiC single crystal 10 after the heat treatment step S1 was observed by the SEM. The results are shown in FIG. 19. The height of the step 103 was measured by an atomic force microscope (AFM), and the width of the terrace 104 was measured by SEM.

FIG. 19 is an SEM image of the surface of the SiC single crystal 10 after the heat treatment step S1. As similar to FIG. 18(*a*), MSB having a height of equal to or greater than 3 nm was formed on the surface of the SiC single crystal 10 before the heat treatment step S1. As illustrated in FIG. 19, it can be seen that no MSB is formed on the surface of the SiC single crystal 10 after the heat treatment step S1 of Example 3, and the steps of 1.0 nm (full unit cell) are regularly arranged.

As described above, according to the growth planarization step S122, the growth layer 105 in which MSB is not formed can be formed by growing the SiC single crystal 10 in a semi-closed space having an atomic number ratio Si/C of greater than 1. This makes it possible to produce a SiC seed crystal 11 in which MSB is removed or reduced.

Example 4: Basal Plane Dislocation Reduction Step

BPD can be removed or reduced by accommodating the SiC single crystal 10 in the main container 20 and the refractory container 40 (see FIG. 15) and performing heat treatment under the following heat treatment conditions.
[SiC Single Crystal 10]
　Polymorphism: 4H—SiC
　Substrate size: Width 10 mm× Length 10 mm× Thickness 0.3 mm
　Off direction and off angle: <11-20> direction and 4° off
　Growth surface: (0001) surface
　Existence of MSB: Not exist
　Existence of strained layer 101: Not exist
[Main Container 20]
　Material: Polycrystalline SiC
　Container size: Diameter 60 mm× Height 4 mm
　Distance between SiC single crystal 10 and SiC material: 2 mm
　Atomic number ratio in container Si/C: equal to or less than 1
[Refractory Container 40]
　Material: TaC
　Container size: Diameter 160 mm× Height 60 mm Si vapor supply source 44 (Si compound): TaSi$_2$
[Heat Treatment Conditions]
　The SiC single crystal 10 arranged under the above condition was heat-treated under the following conditions.
　Heating temperature: 1700° C.
　Heating time: 300 min
　Temperature gradient: 1° C./mm
　Growth rate: 5 nm/min
　Main heating chamber 31 vacuum degree: 10$^{-5}$ Pa
[BPD Conversion Rate in Growth Layer]

Figure 20:
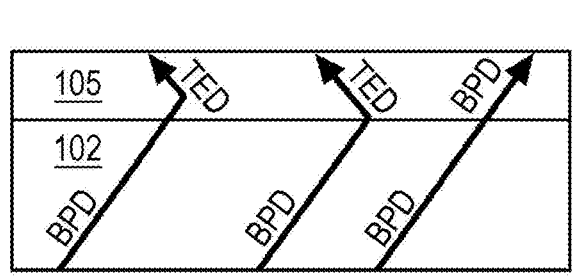
FIG. 20 is an explanatory diagram of a method of obtaining a BPD conversion rate in the basal plane dislocation reduction step of the present invention.
Figure 20:
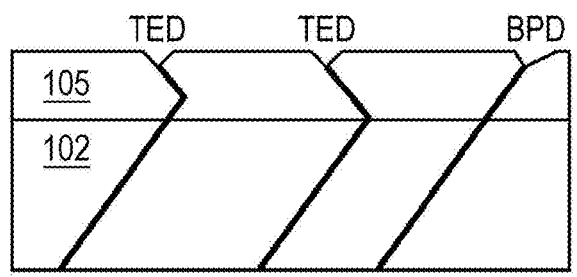
Figure 20:
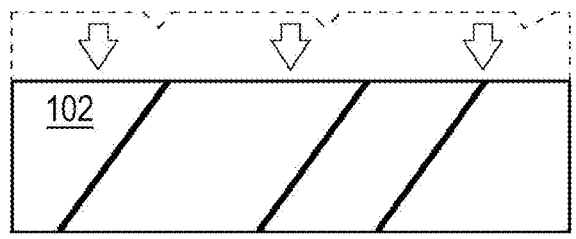
Figure 20:
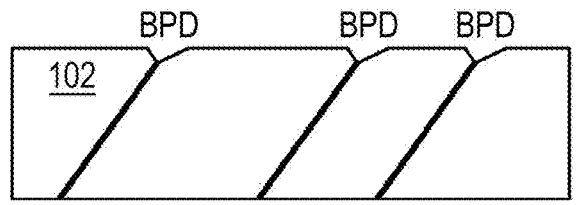

FIG. 20 is an explanatory diagram of a method for obtaining a conversion rate obtained by converting BPD into another defect/dislocation (TED or the like) in the growth layer 105.

FIG. 20(*a*) illustrates the situation where the growth layer 105 has been grown by the heat treatment step S1. In this heating step, the BPD existing in the SiC single crystal 10 is converted to TED with a certain probability. Therefore, TED and BPD are mixed on the surface of the growth layer 105 unless BPD is 100% converted.

FIG. 20(*b*) illustrates the situation where a defect in the growth layer 105 was checked by using the KOH dissolution etching method. This KOH dissolution etching method is a method of immersing a SiC substrate in a molten salt (KOH or the like) heated to about 500° C. to form an etch pit in a dislocation or defective portion, and discriminating a type of dislocation by the size and shape of the etch pit. By this method, the number of BPD existing on the surface of the growth layer 105 is obtained.

FIG. 20(c) illustrates the situation where the growth layer 105 is removed after KOH dissolution etching. In this method, after planarization is performed to the depth of the etch pit by mechanical polishing or CMP, the growth layer 105 is removed by thermal etching to expose the surface of the SiC single crystal 10.

FIG. 20(d) illustrates a state where a defect in the SiC single crystal 10 was checked by using the KOH dissolution etching method for the SiC single crystal 10 from which the growth layer 105 was removed. By this method, the number of BPD existing on the surface of the SiC single crystal 10 is obtained.

According to the sequence illustrated in FIG. 20, by comparing the number of BPD existing on the surface of the growth layer 105 (see FIG. 20(b)) with the number of BPD existing on the surface of the SiC single crystal 10 (FIG. 20(d)), the BPD conversion rate of conversion from BPD to another defect/dislocation during the heat treatment step S1 can be obtained.

The number of BPD existing on the surface of the growth layer 105 of Example 4 was 0 cm², and the number of BPD existing on the surface of the SiC single crystal 10 was about 1000 cm².

That is, it can be understood that BPD is removed or reduced by arranging the SiC single crystal 10 having no MSB on the surface in a semi-closed space having an atomic number ratio Si/C of equal to or less than 1 and growing the single crystal 10.

As described above, according to the basal plane dislocation reduction step S13, by crystal growth of the SiC single crystal 10 in a semi-closed space having an atomic number ratio Si/C of equal to or less than 1 or less, it is possible to form the growth layer 105 having a surface on which BPD has been removed or reduced. This makes it possible to produce a SiC seed crystal 11 having a growth layer 105 from which BPD has been removed or reduced.

[Thermodynamic Calculation]

FIG. 21(a) is a graph showing the relationship between the heating temperature and the etching rate in the etching step of the present invention. The horizontal axis of this graph is the reciprocal of temperature, and the vertical axis of this graph shows the etching rate logarithmically.

FIG. 21(b) is a graph showing the relationship between the heating temperature and the growth rate in the crystal growth step of the present invention. The horizontal axis of this graph is the reciprocal of temperature, and the vertical axis of this graph shows the growth rate logarithmically.

Figure 21:
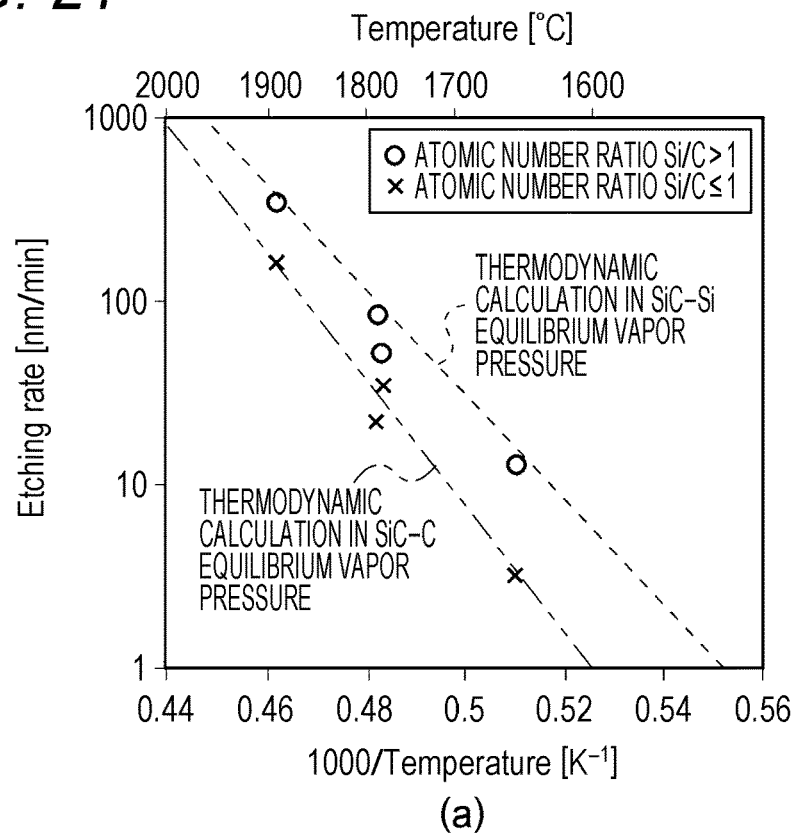
FIG. 21 is an Arrhenius plot of the etching step and the crystal growth step of the present invention.
Figure 21:
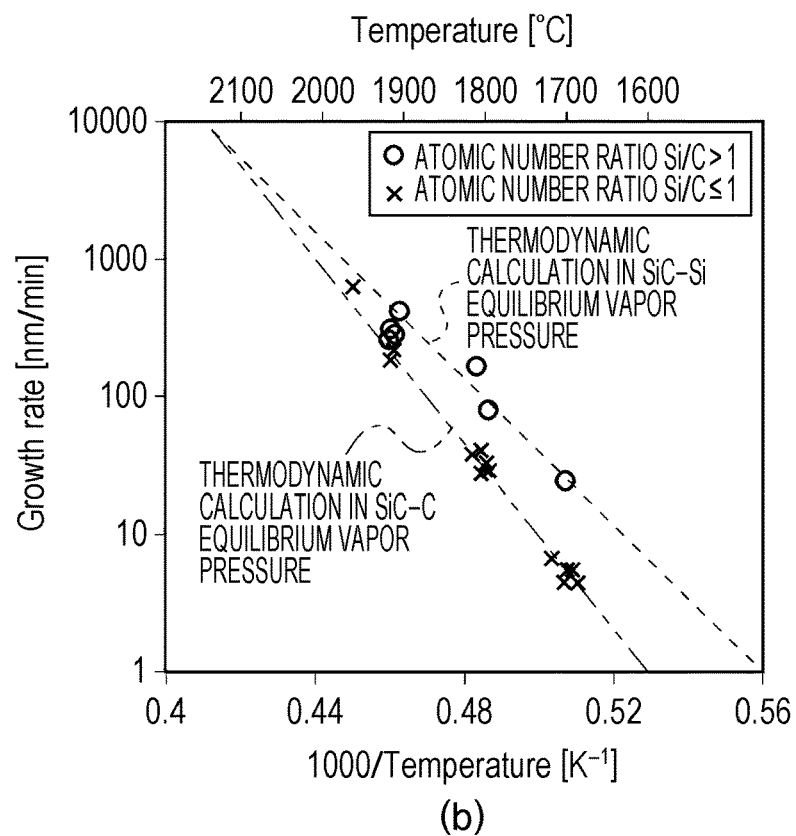

In the graph of FIG. 21, the result of heat treatment of the SiC single crystal 10 by arranging the SiC single crystal 10 in a space (inside the main container 20) where the atomic number ratio Si/C is greater than 1 is indicated by 0. Further, the result of heat treatment of the SiC single crystal 10 by arranging the SiC single crystal 10 in a space (inside the main container 20) where the atomic number ratio Si/C is equal to or less than 1 is indicated by x.

MSB was formed on the surface of the SiC single crystal 10 marked with 0, and the step 103 was the height of one unit cell. On the other hand, MSB was formed on the surface of the SiC single crystal 10 marked with x.

In the graph of FIG. 21, the result of the thermodynamic calculation in the SiC—Si equilibrium vapor pressure environment is shown by a broken line (Arrhenius plot), and the result of the thermodynamic calculation in the SiC—C equilibrium vapor pressure environment is shown by the two-dot chain line (Arrhenius plot).

The thermodynamic calculation of the etching step and the thermodynamic calculation of the crystal growth step will be separately described in detail below.

(Thermodynamic Calculation of Etching Step)

In the thermodynamic calculation of the etching step, the amount of vapor (gas phase species containing Si element and gas phase species containing C element) generated from the SiC single crystal 10 when the main container 20 is heated can be converted into the etching amount. In that case, the etching rate of the SiC single crystal 10 can be obtained by the following Math. 1.

$$\text{Etching rate (m/s)} \propto \sum_{i=SiC, Si_2C, SiC_2} \frac{P_i}{\sqrt{2\pi m_i kT}} \quad [\text{Math. 1}]$$

Here, T is the temperature of the SiC single crystal 10, $m_i$ is the mass of one molecule of the gas phase species ($Si_xC_y$), and k is the Boltzmann constant.

Pi is a value obtained by summing the vapor pressure generated in the main container 20 by heating the SiC single crystal 10. As the gas phase species of Pi, SiC, $Si_2C$, $SiC_2$ and the like are assumed.

The broken line in FIG. 21(a) shows the result of thermodynamic calculation when the single crystal SiC is etched in a vapor pressure environment when SiC (solid) and Si (liquid phase) are in a phase equilibrium state via a gas phase. Specifically, the thermodynamic calculation was performed under the following conditions (i) to (iv) using Math. 1. (i) An environment is a SiC—Si equilibrium vapor pressure environment with a constant volume, (ii) the etching driving force is the temperature gradient in the main container 20, (iii) the source material gas is SiC, $Si_2C$, $SiC_2$, and (iv) the desorption coefficient at which the source material sublimates from the step 103 is 0.001.

The two-dot chain line in FIG. 21(a) shows the result of thermodynamic calculation when the single crystal SiC is etched in a vapor pressure environment when SiC (solid phase) and C (solid phase) are in a phase equilibrium state via a gas phase. Specifically, the thermodynamic calculation was performed under the following conditions (i) to (iv) using Math. 1. (i) An environment is a SiC—C equilibrium vapor pressure environment with a constant volume, (ii) the etching driving force is the temperature gradient in the main container 20, (iii) the source material gas is SiC, $Si_2C$, $SiC_2$, and (iv) the desorption coefficient at which the source material sublimates from the step 103 is 0.001.

Values in the JANAF thermochemical table were used for the data of each chemical species used in the thermodynamic calculation.

According to the graph of FIG. 21(a), it can be seen that the tendency in the result (indicated by 0) of etching the SiC single crystal 10 by arranging the SiC single crystal 10 in a space (inside the main container 20) where the atomic number ratio Si/C is greater than 1 coincides with the tendency in the result of the thermodynamic calculation of the single crystal SiC etching in the SiC—Si equilibrium vapor pressure environment.

Further, it can be seen that the tendency in the result (indicated by x) of etching the SiC single crystal 10 by arranging the SiC single crystal 10 in a space (inside the main container 20) where the atomic number ratio Si/C is equal to or less than 1 coincides with the tendency in the result of the thermodynamic calculation of the single crystal SiC etching in the SiC—C equilibrium vapor pressure environment.

Under the conditions marked with ○ where etching is performed under the SiC—Si equilibrium vapor pressure environment, the formation of MSB is decomposed and suppressed, and steps 103 with a height of 1 nm (one unit cell) are aligned on the surface of the SiC single crystal 10.

On the other hand, it can be seen that MSB is formed under the conditions marked with x where etching is performed under the SiC—C equilibrium vapor pressure environment.

(Thermodynamic Calculation of Crystal Growth Step)

Next, in the thermodynamic calculation of the crystal growth step, the partial pressure difference between the vapor generated from the SiC source material and the vapor generated from the SiC substrate when the main container 20 is heated can be converted into the growth amount. At this time, the chemical potential difference and the temperature gradient can be assumed as the growth driving force. This chemical potential difference can be assumed to be the partial pressure difference of the gas phase species generated on the surface of the polycrystalline SiC (SiC material) and the single crystal SiC (SiC single crystal 10). In that case, the growth rate of the SiC can be obtained by the following Math. 2.

$$\text{Growth rate (m/s)} \propto \sum_{i=SiC, Si_2C, SiC_2} \frac{(P_{raw\ material\ i} - P_{substrate\ i})}{\sqrt{2\pi m_i kT}} \quad \text{[Math. 2]}$$

Here, T is the temperature of the SiC source material side, $m_i$ is the mass of one molecule of the gas phase species ($Si_xC_y$), and k is the Boltzmann constant.

The $P_{source\ material} - P_{substrate}$ is the amount of growth precipitated as SiC when the source material gas becomes supersaturated, and SiC, $Si_2C$, and $SiC_2$ are assumed as the source material gas.

That is, the broken line in FIG. 21(b) shows the result of thermodynamic calculation when the single crystal SiC is grown using polycrystalline SiC as a source material in a vapor pressure environment when SiC (solid) and Si (liquid phase) are in a phase equilibrium state via a gas phase.

Specifically, the thermodynamic calculation was performed under the following conditions (i) to (iv) using Math. 2. (i) An environment is a SiC—Si equilibrium vapor pressure environment with a constant volume, (ii) the growth driving force is the temperature gradient in the main container 20 and the vapor pressure difference (chemical potential difference) between polycrystalline SiC and single crystal SiC, (iii) the source material gas is SiC, $Si_2C$, $SiC_2$, and (iv) the adsorption coefficient at which the source material adsorbs to the step of the SiC single crystal 10 is 0.001.

NM Further, the two-dot chain line in FIG. 21(b) shows the result of thermodynamic calculation when the single crystal SiC is grown using polycrystalline SiC as a source material in a vapor pressure environment when SiC (solid phase) and C (solid phase) are in a phase equilibrium state via a gas phase.

Specifically, the thermodynamic calculation was performed under the following conditions (i) to (iv) using Math. 2. (i) An environment is a SiC—C equilibrium vapor pressure environment with a constant volume, (ii) the growth driving force is the temperature gradient in the main container 20 and the vapor pressure difference (chemical potential difference) between polycrystalline SiC and single crystal SiC, (iii) the source material gas is SiC, $Si_2C$, $SiC_2$, and (iv) the adsorption coefficient at which the source material adsorbs to the step of the SiC single crystal 10 is 0.001.

Values in the JANAF thermochemical table were used for the data of each chemical species used in the thermodynamic calculation.

According to the graph of FIG. 21(b), it can be seen that the tendency in the result (indicated by 0) of growing the growth layer 105 on the SiC single crystal 10 by arranging the SiC single crystal 10 in a space (inside the main container 20) where the atomic number ratio Si/C is greater than 1 coincides with the tendency in the result of the thermodynamic calculation of the SiC growth in the SiC—Si equilibrium vapor pressure environment.

Further, it can be seen that the tendency in the result (indicated by x) of growing the growth layer 105 on the SiC single crystal 10 by arranging the SiC single crystal 10 in a space (inside the main container 20) where the atomic number ratio Si/C is equal to or less than 1 coincides with the tendency in the result of the thermodynamic calculation of the SiC growth in the SiC—C equilibrium vapor pressure environment.

In the SiC—Si equilibrium vapor pressure environment, it is estimated that a growth rate of equal to or greater than 1.0 μm/min is achieved at a heating temperature of 1960° C. Further, it is estimated that a growth rate of equal to or greater than 2.0 μm/min is achieved at a heating temperature of equal to or higher than 2000° C.

On the other hand, in the SiC—C equilibrium vapor pressure environment, it is estimated that a growth rate of equal to or greater than 1.0 μm/min is achieved at a heating temperature of 2000° C. Further, it is estimated that a growth rate of equal to or greater than 2.0 μm/min is achieved at a heating temperature of equal to or higher than 2030° C.

REFERENCE SIGNS LIST

10 SiC single crystal
101 Strained layer
1011 Scratch
1012 Latent scratch
1013 Strain
102 Bulk layer
103 Step
104 Terrace
105 Growth layer
11 SiC seed crystal
12 SiC ingot
13 SiC wafer
14 SiC wafer with epitaxial film
20 Main container
21 Upper container
22 Lower container
23 Gap
24 Substrate holder
25 Si vapor supply source
30 Heating furnace
31 Main heating chamber
32 Preheating chamber
33 Moving means
34 Heater
35 Vacuum forming valve
36 Inert gas injection valve
37 Vacuum gauge
40 Refractory container
41 Upper container
42 Lower container 43 Gap
44 Si vapor supply source
X Etching space
Y Source material supply space
Z Si vapor pressure space
S1 Heat treatment step
S11 Strained layer removal step
S111 Etching bunching step
S12 Planarization step
S121 Etching planarization step
S122 Growth planarization step
S13 Basal plane dislocation reduction step
S2 Ingot growth step
S3 Slicing step
S4 Surface treatment step
S5 Epitaxial growth step

The invention claimed is:

1. A method for producing a SiC seed crystal for growth of a SiC ingot, the method comprising a heat treatment step of heat-treating a SiC single crystal in an atmosphere containing Si element and C element,
wherein the heat treatment step is a step of heat-treating the SiC single crystal in a main container made of a SiC material,
wherein the heat treatment step comprises a planarization step of planarizing a surface of the SiC single crystal, wherein the planarization step is a step of etching the SiC single crystal in a SiC—Si equilibrium vapor pressure environment; and
wherein the heat treatment step comprises at least one step selected from a strained layer removal step of removing a strained layer of the SiC single crystal, and a basal plane dislocation reduction step of forming a growth layer with reduced basal plane dislocation on the SiC single crystal.

2. The method for producing a SiC seed crystal according to claim 1, wherein the heat treatment step includes the basal plane dislocation reduction step after the planarization step,
wherein the basal plane dislocation step is a step of performing a crystal growth of the SiC single crystal in a SiC—C equilibrium vapor pressure environment.

3. The method for producing a SiC seed crystal according to claim 1, wherein the heat treatment step includes the planarization step after the strained layer removal step.

4. The method for producing a SiC seed crystal according to claim 1, wherein the heat treatment step includes the planarization step after the basal plane dislocation reduction step.

5. The method for producing a SiC seed crystal according to claim 1, wherein the heat treatment step includes the basal plane dislocation reduction step after the strained layer removal step.

6. The method for producing a SiC seed crystal according to claim 1, wherein the heat treatment step includes the strained layer removal step, the planarization step, the basal plane dislocation reduction step, and the planarization step in this order.

7. The method for producing a SiC seed crystal according to claim 1, wherein the strained layer removal step is a step of arranging the SiC single crystal and the SiC material so as to face each other and performing heating so that the SiC single crystal is on a high temperature side and the SiC material is on a low temperature side.

8. The method for producing a SiC seed crystal according to claim 1, wherein the planarization step includes a step of arranging the SiC single crystal and the SiC material so as to face each other, and performing heating so as to form a temperature gradient between the SiC single crystal and the SiC material in the SiC—Si equilibrium vapor pressure environment.

9. The method for producing a SiC seed crystal according to claim 1, wherein the planarization step includes a step of arranging the SiC single crystal and the SiC material so as to face each other in a semi-closed space having an atomic number ratio Si/C of greater than 1, and performing heating so as to form a temperature gradient between the SiC single crystal and the SiC material.

10. The method for producing a SiC seed crystal according to claim 1, wherein the planarization step includes a step of accommodating the SiC single crystal and a Si vapor supply source in the main container and performing heating so as to form a temperature gradient in the main container.

11. The method for producing a SiC seed crystal according to claim 1, wherein the planarization step includes a step of arranging the SiC single crystal and the SiC material so as to face each other, and performing heating so that the SiC single crystal is on a high temperature side and the SiC material is on a low temperature side in the SiC—Si equilibrium vapor pressure environment.

12. The method for producing a SiC seed crystal according to claim 1, wherein the planarization step includes a step of arranging the SiC single crystal and the SiC material so as to face each other in a semi-closed space having an atomic number ratio Si/C of greater than 1, and performing heating so that the SiC single crystal is on a high temperature side and the SiC material is on a low temperature side.

13. The method for producing a SiC seed crystal according to claim 1, wherein the basal plane dislocation reduction step is a step of arranging the SiC single crystal and the SiC material so as to face each other, and performing heating so that the SiC single crystal is on the low temperature side and the SiC material is on the high temperature side in a SiC—C equilibrium vapor pressure environment.

14. The method for producing a SiC seed crystal according to claim 1, wherein the basal plane dislocation reduction step is a step of arranging the SiC single crystal and the SiC material so as to face each other in a semi-closed space having an atomic number ratio Si/C of equal to or less than 1, and performing heating so that the SiC single crystal is on the low temperature side and the SiC material is on the high temperature side.

15. A method for producing the SiC ingot, the method comprising an ingot growth step of performing crystal growth of a single crystal SiC on the SiC seed crystal produced by the method according to claim 1.

16. A method for producing a SiC wafer, the method comprising a slicing step of cutting out the SiC wafer from the SiC ingot produced by the method according to claim 15 so as to expose a grown surface.

17. A method for producing a SiC wafer with an epitaxial film, the method comprising an epitaxial growth step of forming an epitaxial film on the grown surface of the SiC wafer produced by the method according to claim 16.

* * * * *